(12) United States Patent
Saida et al.

(10) Patent No.: US 9,882,122 B2
(45) Date of Patent: Jan. 30, 2018

(54) MEMORY DEVICE

(71) Applicant: Kabushiki Kaisha Toshiba, Minato-ku (JP)

(72) Inventors: Daisuke Saida, Shinagawa (JP); Naoharu Shimomura, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/249,837

(22) Filed: Aug. 29, 2016

(65) Prior Publication Data

US 2016/0365508 A1    Dec. 15, 2016

Related U.S. Application Data

(63) Continuation of application No. PCT/JP2015/052995, filed on Feb. 3, 2015.

(30) Foreign Application Priority Data

Mar. 20, 2014  (JP) .................................. 2014-058366

(51) Int. Cl.
G11C 11/00 (2006.01)
H01L 43/08 (2006.01)
G11C 11/16 (2006.01)

(52) U.S. Cl.
CPC ............ H01L 43/08 (2013.01); G11C 11/161 (2013.01); G11C 11/165 (2013.01);
(Continued)

(58) Field of Classification Search
None
See application file for complete search history.

(56) References Cited

U.S. PATENT DOCUMENTS 8,488,375 B2   7/2013  Saida et al.
8,848,433 B2   9/2014  Saida et al.
(Continued)

FOREIGN PATENT DOCUMENTS

JP    2007-142746 A    6/2007
JP    2008-252036      10/2008
(Continued)

OTHER PUBLICATIONS

International Search Report dated Apr. 7, 2015 in PCT/JP2015/052995 filed Feb. 3, 2015 (with English Translation).
(Continued)

*Primary Examiner* — Uyen B Tran
(74) *Attorney, Agent, or Firm* — Oblon, McClelland, Maier & Neustadt, L.L.P.

(57) ABSTRACT

According to one embodiment, a memory device includes a stacked structure and a controller. The stacked structure includes a first magnetic layer, a second magnetic layer stacked with the first magnetic layer, and a first nonmagnetic layer provided between the first magnetic layer and the second magnetic layer. The second magnetic layer includes a first portion and a second portion stacked with the first portion. A magnetic resonance frequency of the first portion is different from a magnetic resonance frequency of the second portion. The controller is electrically connected to the stacked structure and causes a pulse current to flow in the stacked body in a first period. A length of the first period is not less than 0.9 times and not more than 1.1 times the absolute value of an odd number times of the reciprocal of a magnetic resonance frequency of the second magnetic layer.

18 Claims, 15 Drawing Sheets

(52) U.S. Cl.
CPC ...... *G11C 11/1655* (2013.01); *G11C 11/1659* (2013.01); *G11C 11/1673* (2013.01); *G11C 11/1675* (2013.01)

(56) References Cited

U.S. PATENT DOCUMENTS

| | | | |
|---|---|---|---|
| 9,025,368 B2 | 5/2015 | Saida et al. | |
| 2007/0242396 A1* | 10/2007 | Shimazawa | B82Y 10/00 360/324.12 |
| 2009/0015958 A1 | 1/2009 | Nakamura et al. | |
| 2012/0068281 A1 | 3/2012 | Saida et al. | |
| 2012/0241827 A1 | 9/2012 | Daibou et al. | |
| 2013/0077391 A1* | 3/2013 | Luo | H01L 43/08 365/158 |
| 2013/0161768 A1* | 6/2013 | Khvalkovskiy | H01L 43/08 257/421 |
| 2013/0249024 A1* | 9/2013 | Saida | H01L 43/08 257/421 |
| 2013/0343117 A1* | 12/2013 | Lua | G11C 11/1675 365/158 |
| 2014/0085968 A1 | 3/2014 | Saida et al. | |
| 2014/0269037 A1 | 9/2014 | Saida et al. | |
| 2016/0365509 A1* | 12/2016 | Saida | H01F 10/1936 |

FOREIGN PATENT DOCUMENTS

| | | |
|---|---|---|
| JP | 2008-252037 | 10/2008 |
| JP | 2009-21352 A | 1/2009 |
| JP | 2012-64863 A | 3/2012 |
| JP | 2012-69958 A | 4/2012 |
| JP | 2012-204680 | 10/2012 |
| JP | 2013-105506 | 5/2013 |
| JP | 2014-67469 A | 4/2014 |
| JP | 2014-179381 A | 9/2014 |

OTHER PUBLICATIONS

Written Opinion dated Apr. 7, 2015 in PCT/JP2015/052995 filed Feb. 3, 2015.

Office Action dated Sep. 29, 2016 in Japanese Patent Application No. 2014-058366 (with unedited computer generated English translation).

Written Opinion of the International Searching Authority dated Apr. 7, 2015 in PCT/JP2015/052995 filed Feb. 3. 2015 (English translation only).

* cited by examiner

| t1 (nm) | Ms1 (emu/cc) | Ku1 (erg/cc) | Hκ1 (kOe) | f1 (GHz) | Ic1 (µA) |
|---|---|---|---|---|---|
| 1 | 800 | 12M | 22 | 62 | 11 |

| t2 (nm) | Ms2 (emu/cc) | Ku2 (erg/cc) | Hκ2 (kOe) | f2 (GHz) | Ic2 (µA) |
|---|---|---|---|---|---|
| 2 | 500 | 2.4M | 4.6 | 13 | 3.0 |

MEMORY DEVICE

CROSS-REFERENCE TO RELATED APPLICATIONS

This is a continuation application of International Application PCT/JP2015/052995, filed on Feb. 3, 2015; the entire contents of which are incorporated herein by reference.

FIELD

Embodiments described herein relate generally to a memory device.

BACKGROUND

In a configuration of the magnetic random access memory (MRAM), a magnetic tunnel junction (MTJ) element exhibiting the tunneling magnetoresistive (TMR) effect is used for a data memory unit. This configuration is drawing attention as a fast and high-capacity memory device. In such a memory device, reduction of the reversal current for fast magnetization reversal is desired.

DETAILED DESCRIPTION

Figure 1:
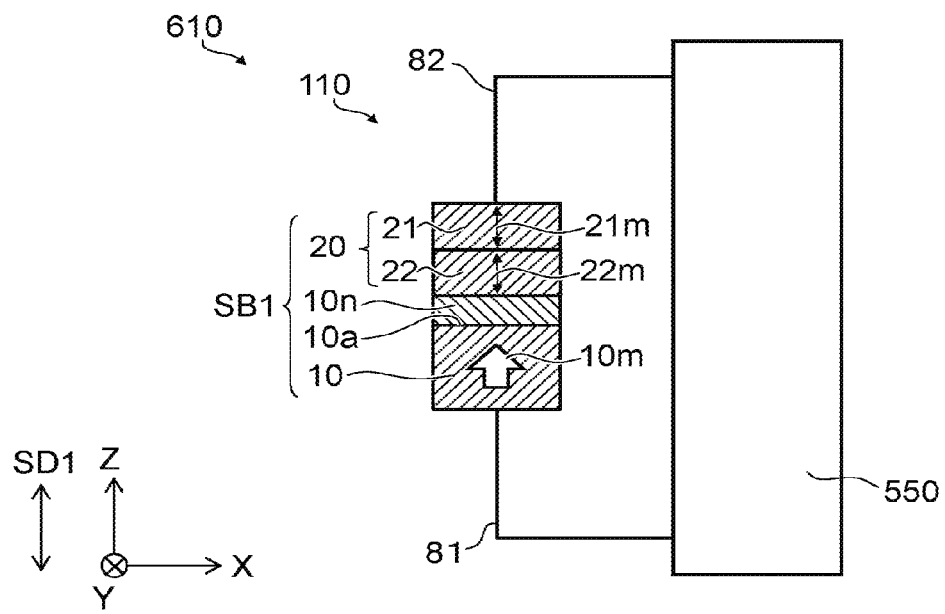
FIG. 1 is a schematic sectional view showing a nonvolatile memory device according to a first embodiment.

According to one embodiment, a memory device includes a stacked structure and a controller. The stacked structure includes a first magnetic layer, a second magnetic layer, and a first nonmagnetic layer. The second magnetic layer is stacked with the first magnetic layer. The second magnetic layer includes a first portion and a second portion. The second portion is stacked with the first portion in a stacking direction of the first magnetic layer and the second magnetic layer. A magnetic resonance frequency of the first portion is different from a magnetic resonance frequency of the second portion. The first nonmagnetic layer is provided between the first magnetic layer and the second magnetic layer. The controller is electrically connected to the stacked structure and causes a pulse current having a magnitude of a first value to flow in the stacked structure in a first period. A length of the first period is not less than 0.9 times and not more than 1.1 times the absolute value of an odd number times of the reciprocal of a magnetic resonance frequency of the second magnetic layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

(First Embodiment)

FIG. 1 is a schematic cross-sectional view illustrating a nonvolatile memory device according to a first embodiment.

As shown in FIG. 1, the nonvolatile memory device 610 according to the embodiment includes a magnetic memory element 110 and a controller 550.

The magnetic memory element 110 includes a stacked body SB1 (a stacked structure). The controller 550 is electrically connected to the magnetic memory element 110. The controller 550 controls the operations of the magnetic memory element 110 by applying a voltage and supplying a current to the magnetic memory element 110.

The stacked body SB1 includes a first ferromagnetic layer 10 (a first magnetic layer), a second ferromagnetic layer 20 (a second magnetic layer), and a first nonmagnetic layer 10n.

The first ferromagnetic layer 10 has a major surface 10a. The direction of a magnetization 10m of the first ferromagnetic layer 10 is substantially fixed. For example, the direction of the magnetization 10m of the first ferromagnetic layer 10 has a component perpendicular to the major surface 10a. The direction of the magnetization 10m of the first ferromagnetic layer 10 is not parallel to the major surface 10a.

The second ferromagnetic layer 20 is stacked with the first ferromagnetic layer 10. The second ferromagnetic layer 20 includes a first portion 21 and a second portion 22. The direction of a magnetization 21m of the first portion 21 is changeable. The second portion 22 is stacked with the first portion 21 in a stacking direction SD1 of the first ferromagnetic layer 10 and the second ferromagnetic layer 20. For example, the stacking direction SD1 is perpendicular to the major surface 10a. In the example, the second portion 22 is provided between the first ferromagnetic layer 10 and the first portion 21. The direction of a magnetization 22m of the second portion 22 is changeable. The magnetization 21m of the first portion 21 has ferromagnetic coupling, antiferromagnetic coupling, or magnetostatic coupling with the magnetization 22m of the second portion 22. The magnetic resonance frequency (a second magnetic resonance frequency) of the second portion 22 is lower than the magnetic resonance frequency (a first magnetic resonance frequency) of the first portion 21. For example, the magnetic resonance frequency of the first portion 21 is 20 GHz or more. For example, the magnetic resonance frequency of the second portion 22 is less than 20 GHz, and more favorably, 15 GHz or less.

The first portion 21 and the second portion 22 include, for example, alloys. The concentration of at least one element included in the second portion 22 is different from the concentration of the same element included in the first portion 21. In other words, the composition ratio of the alloy included in the second portion 22 is different from the composition ratio of the alloy included in the first portion 21. For example, the second portion 22 is the portion of the second ferromagnetic layer 20 where the composition ratio of the alloy is different from that of the first portion 21.

The material of the second portion 22 may be different from the material of the first portion 21. In such a case, the first portion 21 and the second portion 22 each can be considered to be one layer included in the second ferromagnetic layer 20. In other words, the second ferromagnetic layer 20 may be a stacked body including a first layer and a second layer.

The first nonmagnetic layer 10n is provided between the first ferromagnetic layer 10 and the second ferromagnetic layer 20. For example, the first nonmagnetic layer 10n contacts the first ferromagnetic layer 10 and the second ferromagnetic layer 20. The first ferromagnetic layer 10, the second ferromagnetic layer 20, and the first nonmagnetic layer 10n are stacked in the stacking direction SD1.

In the specification of the application, the state of being stacked includes not only the state of being overlaid in direct contact but also the case of being overlaid with another component inserted therebetween.

A direction parallel to the stacking direction SD1 of the stacked body SB1 is taken as a Z-axis direction. One axis perpendicular to the Z-axis is taken as an X-axis. An axis perpendicular to the Z-axis and the X-axis is taken as a Y-axis. The film surfaces of the layers included in the stacked body SB1 are parallel to the X-Y plane. For example, the major surface 10a is parallel to the X-Y plane.

In the example, the magnetic memory element 110 further includes a first conductive layer 81 and a second conductive layer 82. The stacked body SB1 is disposed between the first conductive layer 81 and the second conductive layer 82. The second ferromagnetic layer 20 is disposed between the first ferromagnetic layer 10 and the second conductive layer 82. The first conductive layer 81 is electrically connected to the first ferromagnetic layer 10. The second conductive layer 82 is electrically connected to the second ferromagnetic layer 20.

The first conductive layer 81 and the second conductive layer 82 are electrically connected to the controller 550. The magnetic memory element 110 is directly or indirectly connected to the controller 550 via the first conductive layer 81 and the second conductive layer 82. The first conductive layer 81 and the second conductive layer 82 may be considered to be separate from the magnetic memory element 110. For example, the nonvolatile memory device 610 further includes a first interconnect 91 and a second interconnect 92 (referring to FIG. 20). For example, the first interconnect 91 is electrically connected to the first conductive layer 81. For example, the second interconnect 92 is electrically connected to the second conductive layer 82. For example, the controller 550 is electrically connected to the magnetic memory element 110 via the first interconnect 91 and the second interconnect 92.

According to the nonvolatile memory device 610 according to the embodiment, the current value when programming can be reduced. Also, in the magnetic memory element 110, the magnetization 21m of the first portion 21 and the magnetization 22m of the second portion 22 have ferromagnetic coupling, antiferromagnetic coupling, or magnetostatic coupling. Thereby, for example, the Δ value, i.e., the thermal stability factor, of the second ferromagnetic layer 20 in the magnetostatic state can be increased. Accordingly, misoperations of the magnetic memory element 110 and the nonvolatile memory device 610 can be suppressed. For example, the memory retention time of the magnetic memory element 110 can be lengthened.

The Δ value is, for example, the ratio of the magnetic anisotropy energy and thermal energy of the second ferromagnetic layer 20. For example, the Δ value can be expressed by the following formula.

$$\Delta = Ku \cdot V / K_B \cdot T$$

In the formula recited above, Ku is the effective magnetic anisotropy constant, V is the volume of the second ferromagnetic layer 20, $K_B$ is the Boltzmann constant, and T is the absolute temperature of the magnetic memory element 110.

An example of the configuration and operations of the magnetic memory element 110 will now be described. The description recited below is applicable to not only the magnetic memory element 110 but also the other magnetic memory elements according to the embodiment described below.

In the magnetic memory element 110, spin-polarized electrons are caused to act on the second ferromagnetic layer 20 by causing a current to flow in the stacked body SB1 in the stacking direction SD1. Thereby, the direction of the magnetization 21m of the first portion 21 of the second ferromagnetic layer 20 and the direction of the magnetization 22m of the second portion 22 are set in a direction corresponding to the orientation of the current.

For example, the first ferromagnetic layer 10 functions as a first fixed magnetic layer. For example, in the first ferromagnetic layer 10, the direction of the magnetization 10m is fixed in a direction substantially perpendicular to the film surface. The direction of the magnetization 10m of the first ferromagnetic layer 10 is substantially parallel to the stacking direction SD1.

In the first portion 21 of the second ferromagnetic layer 20, for example, the direction of the magnetization 21m of the first portion 21 is a direction substantially perpendicular to the film surface and substantially parallel to the stacking direction SD1. The direction of the magnetization 21m of the first portion 21 is reversible. The first portion 21 performs the role of storing data. For example, the first portion 21 functions as a magnetic memory layer.

In the second portion 22 of the second ferromagnetic layer 20, for example, the direction of the magnetization 22m of the second portion 22 is a direction substantially perpendicular to the film surface and substantially parallel to the stacking direction SD1. The direction of the magnetization 22m of the second portion 22 is reversible. For example, magnetization reversal of the magnetization 22m of the second portion 22 occurs earlier than that of the magnetization 21m of the first portion 21 when the current flows in the stacked body SB1 in the stacking direction SD1; and the magnetization 22m of the second portion 22 assists the magnetization reversal of the magnetization 21m of the first portion 21. For example, the second portion 22 functions as a trigger of the magnetization reversal of the first portion 21. For example, the second portion 22 is called a trigger layer.

The second portion 22 also contributes to the memory retention of the data. Accordingly, the second ferromagnetic layer 20 may be used as the magnetic memory layer; the first portion 21 may be considered to be the main body portion of the memory retention; and the second portion 22 may be considered to be the trigger portion of the magnetization reversal.

The first nonmagnetic layer 10n functions as a spacer layer. In the case where the first nonmagnetic layer 10n is a tunneling barrier layer based on an insulating material, the stacked body SB1 that includes the first ferromagnetic layer 10, the first nonmagnetic layer 10n, and the second ferromagnetic layer 20 has, for example, a MTJ (Magnetic Tunnel Junction) structure.

Figures 2A, 2B:
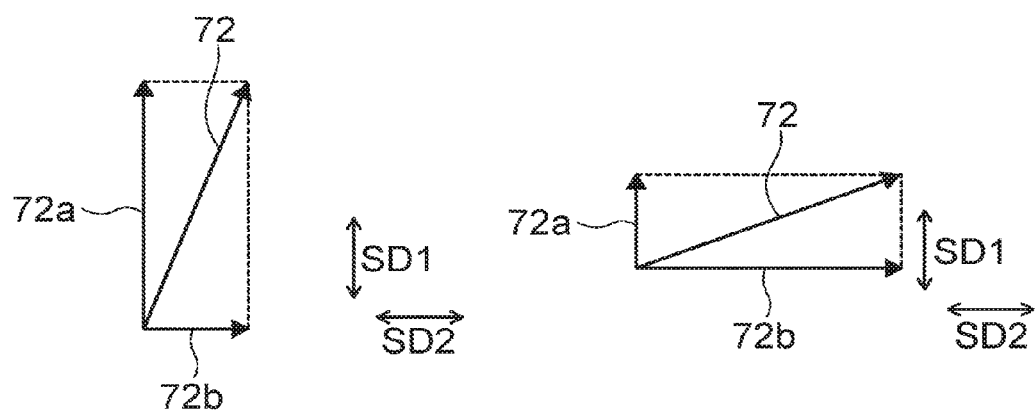
FIG. 2A and FIG. 2B are schematic views showing magnetizations.

FIG. 2A and FIG. 2B are schematic views illustrating the magnetizations.

FIG. 2A shows the magnetization of a perpendicular magnetization film. FIG. 2B shows the magnetization of an in-plane magnetization film.

As shown in FIG. 2A and FIG. 2B, one direction perpendicular to the stacking direction SD1 is taken as an in-plane direction SD2. The in-plane direction SD2 is a direction in the X-Y plane. An in-plane magnetization component 72b of a magnetization 72 is the component of the magnetization 72 projected onto the X-Y plane. The in-plane magnetization component 72b is parallel to the in-plane direction SD2. A perpendicular magnetization component 72a of the magnetization 72 is the component of the magnetization projected onto the Z-axis direction. The perpendicular magnetization component 72a is parallel to the stacking direction SD1.

As shown in FIG. 2A, the perpendicular magnetization film has a magnetization state in which the perpendicular magnetization component 72a is larger than the in-plane magnetization component 72b. For the operating characteristics in the perpendicular magnetization film, it is desirable that the direction of the magnetization is substantially perpendicular to the film surface.

As shown in FIG. 2B, the in-plane magnetization film has a magnetization state in which the in-plane magnetization component 72b is larger than the perpendicular magnetization component 72a. For the operating characteristics in the in-plane magnetization film, it is desirable that the direction of the magnetization is substantially parallel to the film surface.

For convenience of description, the direction from the first ferromagnetic layer 10 toward the second ferromagnetic layer 20 is called "up" or "upward." The direction from the second ferromagnetic layer 20 toward the first ferromagnetic layer 10 is called "down" or "downward."

As described above, the direction of the magnetization 10m of the first ferromagnetic layer 10 is substantially fixed.

In the magnetic memory element 110 as shown in FIG. 1, the direction of the magnetization 10m of the first ferromagnetic layer 10 is upward. However, various modifications of the direction of the magnetization 10m of the first ferromagnetic layer 10 are possible. For example, the direction of the magnetization 10m of the first ferromagnetic layer 10 may be downward.

In the magnetic memory element 110, for example, an electron current can be caused to flow in the stacked body SB1 via the first conductive layer 81 and the second conductive layer 82. The electron current is the flow of electrons. The electron current flows downward when the current flows upward.

In the magnetic memory element 110, the direction of the magnetization 21m of the first portion 21 and the direction of the magnetization 22m of the second portion 22 can be controlled by causing the electron current to flow in the stacked body SB1. Specifically, the orientation of the magnetization 21m of the first portion 21 and the orientation of the magnetization 22m of the second portion 22 can be reversed by changing the orientation (the polarity) of the flow of the electron current. In the case where information is stored, for example, "0" and "1" are allotted respectively according to the directions of the magnetization 21m of the first portion 21. The magnetic memory element 110 has a first state, or a second state that is different from the first state. The first state and the second state correspond respectively to two different directions of the magnetization 21m of the first portion 21.

As a specific example of the operations of the magnetic memory element 110, first, an example of the "programming" operation will be described.

FIG. 3A to FIG. 3F are schematic views illustrating operations of the nonvolatile memory device according to the first embodiment.

These drawings show the state of the stacked body SB1 in the "programming" operation of the magnetic memory element 110. In the programming operation, the programming operation of the second ferromagnetic layer 20 is implemented by causing an electron current 60 (a programming current Iw) to flow across the film surface of the first ferromagnetic layer 10 and the film surface of the second ferromagnetic layer 20. Here, the case where the magnetoresistance effect via the first nonmagnetic layer 10n is the normal type will be described.

In the magnetoresistance effect of the "normal type," the electrical resistance when the magnetizations of the magnetic layers on two sides of the nonmagnetic layer are parallel to each other is lower than the electrical resistance when the magnetizations are antiparallel. In the case of the normal type, the electrical resistance between the first ferromagnetic layer and the second ferromagnetic layer 20 via the first nonmagnetic layer 10n is lower when the direction of the magnetization 10m of the first ferromagnetic layer 10 is parallel to the directions of the magnetizations 21m and 22m of the second ferromagnetic layer 20 than when antiparallel.

Figures 3A, 3B, 3C:
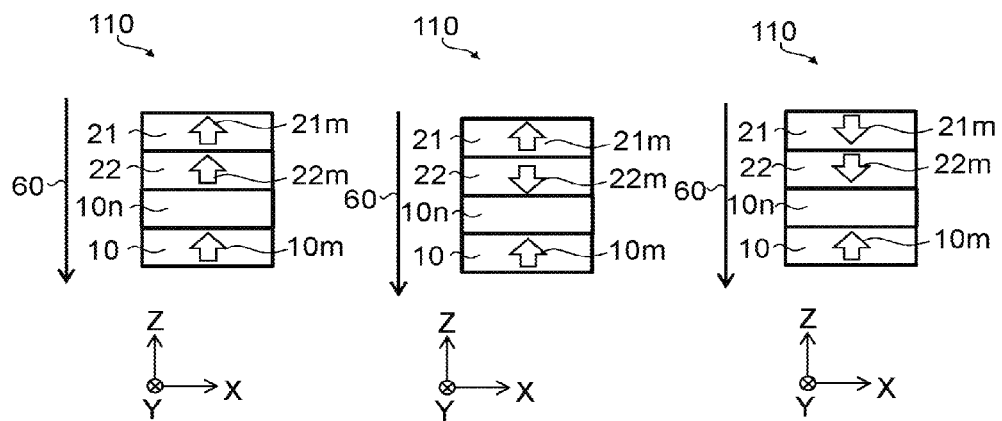
FIG. 3A to FIG. 3F are schematic views showing the operation of the nonvolatile memory device according to the first embodiment.

FIG. 3A to FIG. 3C show the case where the orientations of the magnetization 21m of the first portion 21 and the magnetization 22m of the second portion 22 of the second ferromagnetic layer 20 are reversed from upward to downward.

FIG. 3A shows the state in which the electron current 60 has started to flow. FIG. 3C shows the state in which the flow of the electron current 60 has ended (the state in which the direction of the magnetization 21m and the direction of the magnetization 22m are reversed). FIG. 3B shows an intermediate state.

As shown in FIG. 3A, in the case where the orientation of the magnetization 21m and the orientation of the magnetization 22m are reversed from upward to downward, the electron current 60 is caused to flow from the second ferromagnetic layer 20 toward the first ferromagnetic layer 10. In other words, the electron current 60 is caused to flow downward.

In the embodiment, the electron current 60 is e.g. the single pulse current described later. The electron current 60 is e.g. a rectangular wave. As described later, the electron current 60 has multiple frequency components. The multiple frequency components have mutually-different amplitudes. For example, among the multiple components, the amplitude of the component is larger as the oscillation frequency of the component is lower.

When the electron current 60 is caused to flow downward, among the electrons passing through the first nonmagnetic layer 10n, the electrons that have a spin having the same orientation as the magnetization 10m of the first ferromagnetic layer 10 (in the example, upward) pass through the first ferromagnetic layer 10. On the other hand, the electrons that have a spin having the reverse orientation of the magnetization 10m of the first ferromagnetic layer 10 (in the example, downward) are reflected at the interface between the first ferromagnetic layer 10 and the first nonmagnetic layer 10n. The angular momentum of the spin of the reflected electrons is transferred to the second ferromagnetic layer 20 and acts on the magnetization 21m and the magnetization 22m of the second ferromagnetic layer 20.

As described above, the electron current 60 has components oscillating at multiple frequencies. Therefore, an angular momentum aJ of the spin of the reflected electrons also has components oscillating at multiple frequencies. For example, the spin angular momentum aJ is linked to the magnetic field by the relationship aJ=h(bar)×g(theta)/(2dMe)×j. Therefore, it can also be said that the magnetic field (the oscillating magnetic field) having the frequency components acts on the magnetization 21m and the magnetization 22m of the second ferromagnetic layer 20. h(bar), g(theta), d, M, and e respectively are the value of Planck's constant divided by 2π, the spin injection efficiency, the film thickness, the magnetization, and the elementary charge. Because, for example, among the components of the electron current 60, the amplitude is larger as the oscillation frequency of the component is lower, the amplitude is relatively large for the component oscillating at the low frequency for the oscillating magnetic field as well. For example, the case is considered where the frequency of a relatively low-frequency component of the high frequency components is near the magnetic resonance frequency of the second ferromagnetic layer 20 (the entirety of the memory layer and the trigger layer).

As shown in FIG. 3B, the oscillating magnetic field that is generated by the spin-polarized electrons reflected at the interface with the first ferromagnetic layer 10 has a frequency component corresponding to the resonance frequency of the second ferromagnetic layer 20 (the entirety of the memory layer and the trigger layer). Therefore, the orientation of the magnetization 22m of the trigger layer reverses from upward to downward at a current that is small compared to the case where the spin angular momentum does not have a frequency component corresponding to the resonance frequency. For example, this reversal helps the orientation of the magnetization 21m of the memory layer to reverse.

As shown in FIG. 3C, when the orientation of the magnetization 22m of the second portion 22 reverses from upward to downward, the orientation of the magnetization 21m of the first portion 21 reverses from upward to downward due to the action of the spin-polarized electrons and the action of the magnetization 22m having the ferromagnetic coupling, the antiferromagnetic coupling, or the magnetostatic coupling.

When the supply of the electron current 60 is stopped, the orientation of the magnetization 21m and the orientation of the magnetization 22m are maintained in the state of being reversed from upward to downward. For example, "0" is allotted to the state of the second ferromagnetic layer 20 having the magnetization 21m and the magnetization 22m of this orientation. In the magnetic memory element 110, for example, the state in which the orientation of the magnetization 21m and the orientation of the magnetization 22m of the second ferromagnetic layer 20 are downward corresponds to a first state.

Figures 3D, 3E, 3F:
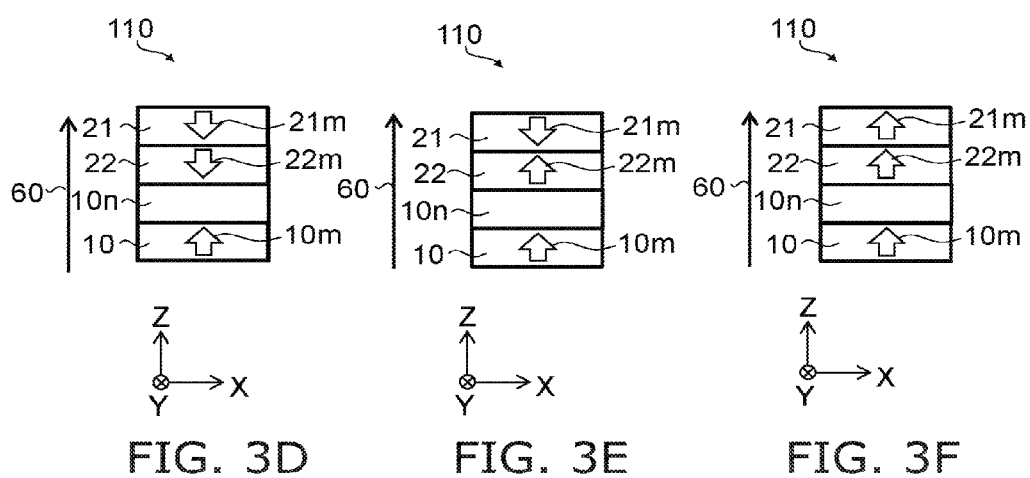

FIG. 3D to FIG. 3F show the case where the orientations of the magnetization 21m of the first portion 21 and the magnetization 22m of the second portion 22 are reversed from downward to upward.

FIG. 3D shows the state in which the electron current 60 starts to flow. FIG. 3F shows the state in which the flow of the electron current 60 has ended (the state in which the direction of the magnetization 21m and the direction of the magnetization 22m have reversed). FIG. 3E shows an intermediate state.

As shown in FIG. 3D, in the case where the orientation of the magnetization 21m and the orientation of the magnetization 22m are reversed from downward to upward, the electron current 60 is caused to flow from the first ferromagnetic layer 10 toward the second ferromagnetic layer 20. In other words, the electron current 60 is caused to flow upward.

As shown in FIG. 3E, when the electron current 60 is caused to flow upward, the electrons that have a spin having the same orientation as the magnetization 10m of the first ferromagnetic layer 10 (in the example, upward) pass through the first ferromagnetic layer 10 and are transferred to the second ferromagnetic layer 20. For example, a magnetic field that oscillates is generated by the electrons having the upward spin. Due to the assist of the oscillating magnetic field, the orientation of the magnetization 22m of the second portion 22 is reversed from downward to upward by a current that is smaller than in the case of no assist. For example, this reversal helps the orientation of the magnetization 21m of the memory layer to reverse.

As shown in FIG. 3F, when the supply of the electron current 60 is stopped, the orientation of the magnetization 21m and the orientation of the magnetization 22m are maintained in the state of being reversed from downward to upward. For example, "1" is allotted to the state of the second ferromagnetic layer 20 having the magnetization 21m and the magnetization 22m of this orientation. In the magnetic memory element 110, for example, the state in which the orientations of the magnetization 21m and the magnetization 22m of the second ferromagnetic layer 20 are upward corresponds to a second state.

Based on such actions, "0" and "1" are appropriately allotted respectively to the different multiple states of the second ferromagnetic layer 20. Thereby, the "programming" of the magnetic memory element 110 is implemented.

In the case where the magnetoresistance effect is the "reverse type," the electrical resistance between the first ferromagnetic layer 10 and the second ferromagnetic layer 20 via the first nonmagnetic layer 10n is higher when the direction of the magnetization 10m of the first ferromagnetic layer 10 is parallel to the directions of the magnetizations 21m and 22m of the second ferromagnetic layer 20 than when antiparallel. The "programming" operation of the reverse type is similar to the case of the normal type.

In the example, for example, the first state is "0;" and the second state is "1". The first state may be "1;" and the second state may be "0". The first state and the second state are not limited to "0" or "1" and may be other states. The number of states provided in the magnetic memory element 110 may be three or more. In other words, the magnetic memory element 110 may be a multi-bit memory element.

The setting of the first state or the second state is implemented by the controller 550. For example, the setting of the first state corresponds to "programming;" and the setting of the second state corresponds to "erasing." The setting of the second state may correspond to "programming;" and the setting of the first state may correspond to "erasing."

For example, the supply of the electron current 60 is performed by the controller 550. The controller 550 supplies the magnetic memory element 110 with e.g. a pulse current of 2 nanoseconds or less in the programming operation. The pulse current has a component oscillating at a high frequency. A very fast programming operation can be performed by the magnetic resonance effect of the oscillation with the magnetization 21m and the magnetization 22m.

An example of the "read-out" operation will now be described.

For example, the sensing of the directions of the magnetization 21m and the magnetization 22m of the second ferromagnetic layer 20 of the magnetic memory element 110 is implemented by utilizing the magnetoresistance effect. In the magnetoresistance effect, the electrical resistance changes due to the relative orientation of the magnetization of each layer. In the case where the magnetoresistance effect is utilized, a sense current is caused to flow between the first ferromagnetic layer 10 and the second ferromagnetic layer 20; and the magnetoresistance is measured. The current value of the sense current is less than the current value corresponding to the electron current 60 caused to flow when programming (when storing).

Figure 4A:
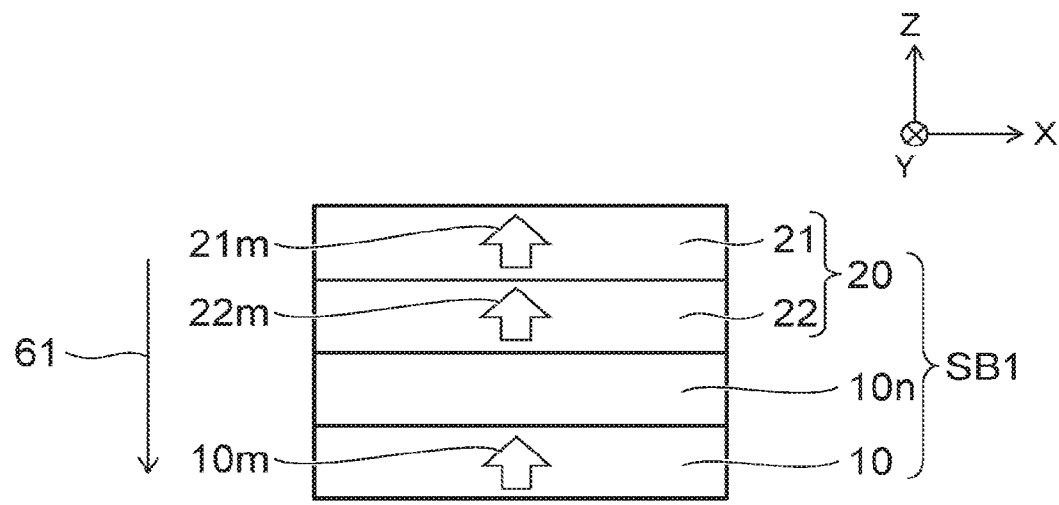
FIG. 4A and FIG. 4B are schematic views showing the operation of the nonvolatile memory device according to the first embodiment.
Figure 4B:
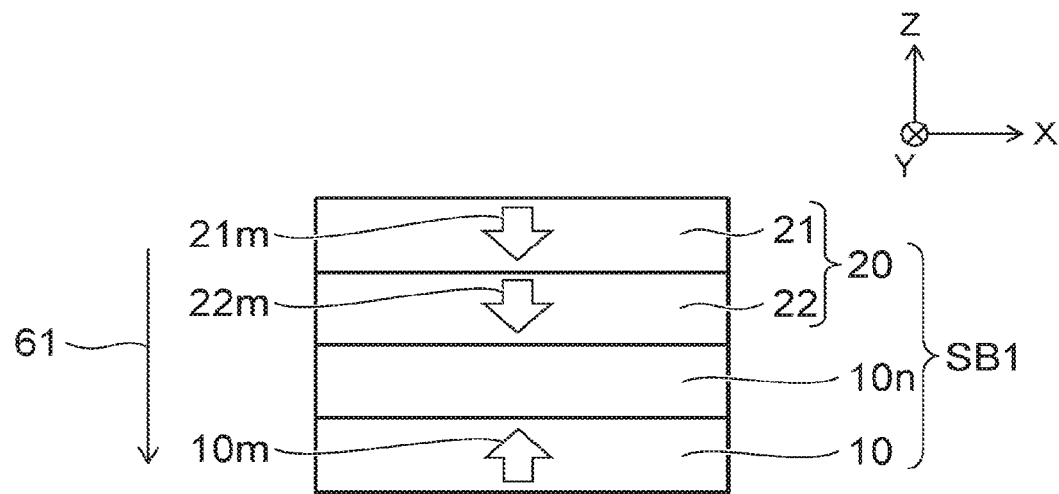

FIG. 4A and FIG. 4B are schematic views illustrating an operation of the nonvolatile memory device according to the first embodiment.

These drawings show the state of the stacked body SB1 in the "read-out" operation of the magnetic memory element 110.

FIG. 4A shows the case where the direction of the magnetization 10m of the first ferromagnetic layer 10 is the same as the directions of the magnetization 21m and the magnetization 22m of the second ferromagnetic layer 20. FIG. 4B shows the case where the direction of the magnetization 10m of the first ferromagnetic layer 10 is antiparallel (reverse orientation) to the directions of the magnetization 21m and the magnetization 22m of the second ferromagnetic layer 20.

As shown in FIG. 4A and FIG. 4B, a sense current 61 is caused to flow in the stacked body SB1; and the electrical resistance is sensed.

For the normal magnetoresistance effect, the resistance in the state of FIG. 4A is lower than the resistance in the state of FIG. 4B. For the reverse magnetoresistance effect, the resistance in the state of FIG. 4A is higher than the resistance in the state of FIG. 4B.

It is possible to read the stored binary data by associating "0" and "1" respectively with these multiple states having mutually-different resistances. The orientation of the sense current 61 may be the reverse orientation of the direction shown in FIG. 4A and FIG. 4B.

For example, the supply of the sense current 61 is performed by the controller 550.

As recited above, the programming to the second ferromagnetic layer 20 which is the memory layer and the trigger layer is performed by spin torque programming. In such a magnetic memory element 110, for example, due to the demand for higher bit density, it is desirable to set the width of the magnetic memory element 110 (e.g., the width of the second ferromagnetic layer 20) to be 35 nm or less. The width of the magnetic memory element 110 is, for example, the length in the X-axis direction or the Y-axis direction of the magnetic memory element 110. Also, in the case where the configuration of the magnetic memory element 110 projected onto the X-Y plane is a circle or an ellipse, the width of the magnetic memory element 110 is the diameter (the major diameter) of the magnetic memory element 110.

In the case where the width of the magnetic memory element 110 is 35 nm or less, the thermal stability factor can be maintained by providing the second ferromagnetic layer 20, the first portion 21, and the second portion 22 and by providing ferromagnetic coupling, antiferromagnetic coupling, or magnetostatic coupling between the magnetization 21m of the first portion 21 and the magnetization 22m of the second portion 22. Thereby, misoperations can be suppressed in the magnetic memory element 110 and the nonvolatile memory device 610 according to the embodiment.

In a MTJ of a cache memory application, it is sufficient for the $\Delta$ value to be such that the time necessary for caching can be maintained sufficiently. On the other hand, in a large-capacity memory cell, it is desirable for the $\Delta$ value to be large, e.g., 60 or more. Also, in the large-capacity memory cell, from the perspective of integration, it is desirable for the width of the magnetic memory element to be 35 nm or less.

As described above, the $\Delta$ value affects the element size. Therefore, in the case where the element size is small, it is necessary for the memory layer to include a material having a large effective magnetic anisotropy constant Ku.

Figure 5:
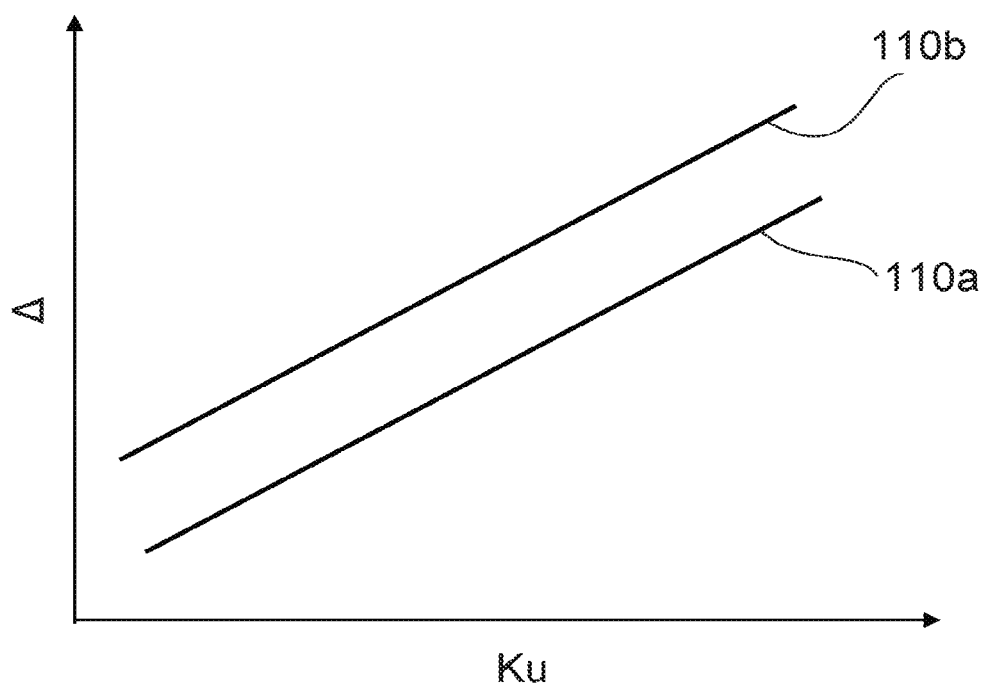
FIG. 5 is a graph showing the characteristics of the nonvolatile memory device according to the embodiment.

FIG. 5 is a graph illustrating characteristics of nonvolatile memory devices according to the embodiment.

FIG. 5 shows the characteristics of a magnetic memory element 110a and a magnetic memory element 110b.

The vertical axis of FIG. 5 is the $\Delta$ value of the second ferromagnetic layer 20. The horizontal axis of FIG. 5 is the effective magnetic anisotropy constant Ku of the second ferromagnetic layer 20.

A configuration similar to that of the magnetic memory element 110 is applicable to the magnetic memory element 110a and the magnetic memory element 110b. A saturation magnetization Ms of the second portion 22 of the magnetic memory element 110a is larger than the saturation magnetization Ms of the second portion 22 of the magnetic memory element 110b.

As shown in FIG. 5, the Δ value increases as the effective magnetic anisotropy constant Ku is increased. For example, the Δ value can be increased by providing the trigger layer (the second portion 22). In other words, by providing the trigger layer, the thermal stability factor can be maintained even in the case where the size of the magnetic memory element is reduced.

An effective anisotropic magnetic field Hk of the memory layer is proportional to the effective magnetic anisotropy constant Ku. For example, Hk is expressed by the formula Hk=2·Ku/Ms. Ms is the saturation magnetization. Therefore, the effective anisotropic magnetic field Hk of the memory layer is high in the case where the memory layer includes a material having a large effective magnetic anisotropy constant Ku.

In the case where the effective anisotropic magnetic field Hk of the memory layer is high, for example, the magnetic resonance frequency of the memory layer is high. For example, in the case where the Δ value is set to 60 or more, there are cases where the Hk is about 10 kOe to 20 kOe and the resonance frequency of the memory layer is a high frequency wave of about 30 GHz to 60 GHz.

Conversely, in the embodiment, by setting the magnetic resonance frequency (the second magnetic resonance frequency) of the second portion 22 to be lower than the magnetic resonance frequency (the first magnetic resonance frequency) of the first portion 21, the direction of the magnetization 21$m$ and the direction of the magnetization 22$m$ can be reversed at a frequency lower than the magnetic resonance frequency of the first portion 21. Thereby, the resonance frequency (a third magnetic resonance frequency) of the (overall) second ferromagnetic layer 20 can be reduced.

Thus, by providing the first portion 21 and the second portion 22 in the second ferromagnetic layer 20 of the magnetic memory element 110 according to the embodiment, the magnetic resonance frequency can be reduced while maintaining the thermal stability factor even in the case where the element is downscaled.

For example, the magnetization of the first portion 21 is taken as $Ms_1$ (emu/cm$^3$); the magnetic anisotropy constant of the first portion 21 is taken as $Ku_1$ (erg/cm$^3$); and the thickness of the first portion 21 is taken as d1(cm). The magnetization of the second portion 22 is taken as $Ms_2$ (emu/cm$^3$); the magnetic anisotropy constant of the second portion 22 is taken as $Ku_2$ (erg/cm$^3$); the thickness of the second portion 22 is taken as d2(cm); and the demagnetizing factor of the second portion 22 is taken as $N_{z2}$. The exchange coupling constant between the magnetization 21$m$ of the first portion 21 and the magnetization 22$m$ of the second portion 22 is taken as Jex (erg/cm$^2$). The gyromagnetic constant is taken as γ (1/(Oe·S)). In such a case, the magnetic resonance frequency when the first portion 21 and the second portion 22 are stacked (the magnetic resonance frequency of the entire second ferromagnetic layer 20) is provided by the following formula.

[Formula 1]

$$f = \frac{\gamma}{2\pi} \sqrt{\left(\frac{J_{ex}^2}{Ms_1 d_1 \cdot Ms_2 d_2}\right) + \left(\frac{J_{ex}}{Ms_2 d_2} + \frac{2Ku_2}{Ms_2} - 4\pi N_{z2} Ms_2\right)^2} \quad (1)$$

Figures 6A, 6B, 6C:
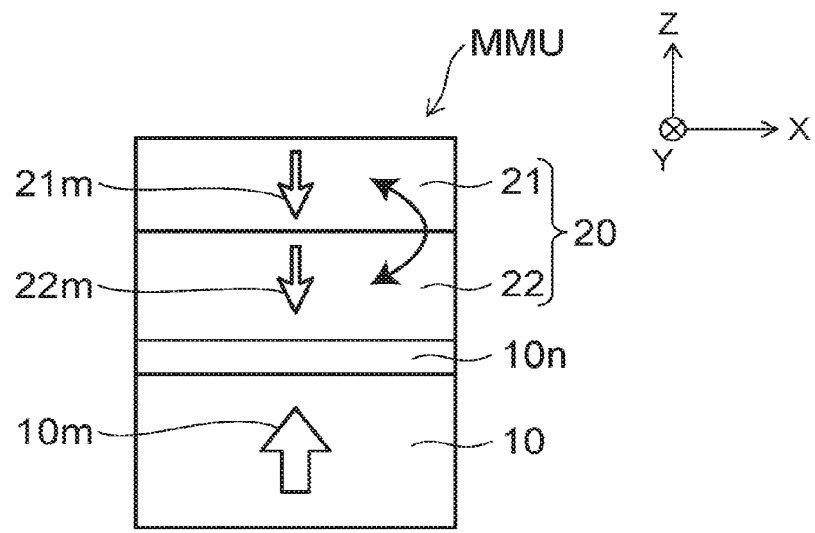
FIG. 6A to FIG. 6C are schematic views showing the conditions of the simulation of the magnetic memory unit according to the first embodiment.

FIG. 6A to FIG. 6C are schematic views illustrating conditions of a simulation of the magnetic memory unit according to the first embodiment.

FIG. 6A is a schematic cross-sectional view showing the magnetic memory unit used in the simulation. FIG. 6B is a table showing the simulation conditions relating to the first portion 21. FIG. 6C is a table showing the simulation conditions relating to the second portion 22.

By Micromagnetics-LLG in the simulation, it is confirmed that by providing the trigger layer, the magnetization reversal is assisted by a magnetic field of a frequency lower than the magnetic resonance frequency of the memory layer.

As shown in FIG. 6A, in a magnetic memory unit MMU used in the simulation, the first ferromagnetic layer 10, the first nonmagnetic layer 10$n$, and the second ferromagnetic layer 20 are stacked in this order. The second portion 22 is provided between the first ferromagnetic layer 10 and the first portion 21 in the second ferromagnetic layer 20. In other words, the stacking order of the magnetic memory unit MMU is the same as the stacking order of the stacked body SB1 of the magnetic memory element 110. The configuration of the magnetic memory unit MMU projected onto the X-Y plane was set to be a circle. The diameter of the magnetic memory unit MMU was set to 16 nm.

As shown in FIG. 6B, in the first portion 21 (the memory layer) of the magnetic memory unit MMU, a thickness t1 is 1 nm; the saturation magnetization Ms1 is 800 emu/cc; the effective magnetic anisotropy constant Ku1 is 12×10$^6$ erg/cm$^3$; and an effective anisotropic magnetic field Hk1 is 22 kOe. In such a case, a magnetic resonance frequency f1 (the first magnetic resonance frequency) is 62 GHz; and a threshold current Ic1 is 11 uA.

As shown in FIG. 6C, in the second portion 22 (the trigger layer) of the magnetic memory unit MMU, a thickness t2 is 2 nm; the saturation magnetization Ms2 is 500 emu/cc; the effective magnetic anisotropy constant Ku2 is 2.4×10$^6$ erg/cm$^3$; and an effective anisotropic magnetic field Hk2 is 4.6 kOe. In such a case, a magnetic resonance frequency f2 (the second magnetic resonance frequency) is 13 GHz; and a threshold current Ic2 is 3 uA.

In the simulation, a rotating magnetic field having the frequency as a parameter was applied to the magnetic memory unit MMU. The magnetic field strength of the rotating magnetic field was set to about 10% of the effective anisotropic magnetic field Hk1 of the first portion 21. A current having a magnitude of twice the threshold current Ic1 of the first portion 21 was caused to flow upward from below.

Figures 7A, 7B:
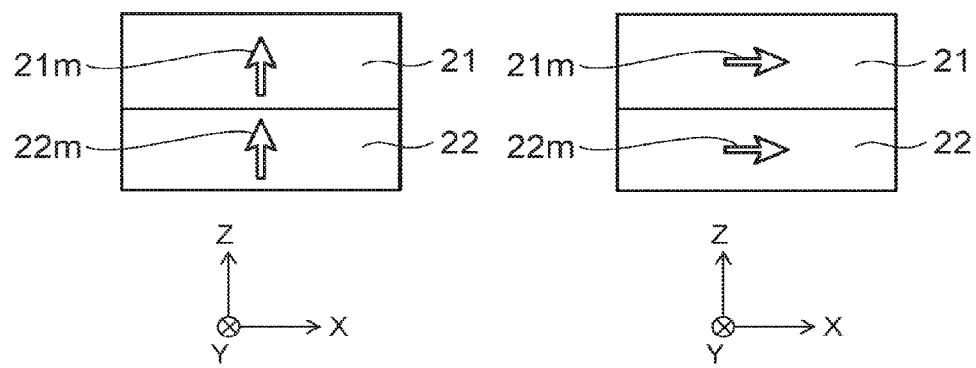
FIG. 7A to FIG. 7C are schematic views showing a simulation result for the magnetic memory unit according to the first embodiment.
Figure 7C:
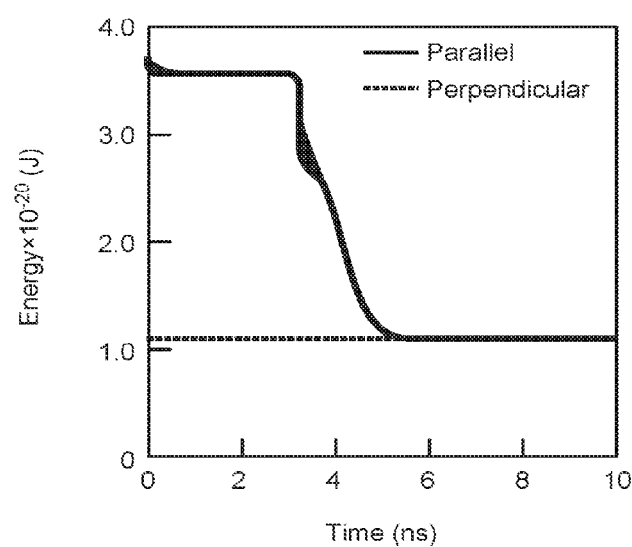

FIG. 7A to FIG. 7C are schematic views illustrating the simulation results of the magnetic memory unit according to the first embodiment.

FIG. 7A shows the case where the first portion 21 and the second portion 22 of the magnetic memory unit MMU are magnetized in the perpendicular direction. FIG. 7B shows the case where the first portion 21 and the second portion 22 of the magnetic memory unit MMU are magnetized in the in-plane direction. FIG. 7C is a graph showing the simulation results. The horizontal axis of FIG. 7C is time (nanoseconds); and the vertical axis is energy (J).

In the simulation, it was examined whether or not the thermal stability factor (the Δ value) of the second ferromagnetic layer 20 is reduced by providing the trigger layer.

As shown in FIG. 7A and FIG. 7B, the magnetization relaxation process for 10 ns was calculated for the initial magnetizations of the memory layer and the trigger layer in the case where each was tilted in the in-plane direction and in the case where each was tilted in the perpendicular direction. In this system, the perpendicular magnetization is stable. On the other hand, the in-plane magnetization exceeded the energy barrier and relaxed to the perpendicular magnetization after a constant amount of time.

As shown in FIG. 7C, the perpendicular magnetization is a constant value. On the other hand, after maintaining a high energy state until about 3 ns, the in-plane magnetization relaxes to the perpendicular magnetization and transitions to the low energy state. The Δ value of the second ferromagnetic layer 20 was determined from the difference of the energy barriers at this time.

Figure 8:
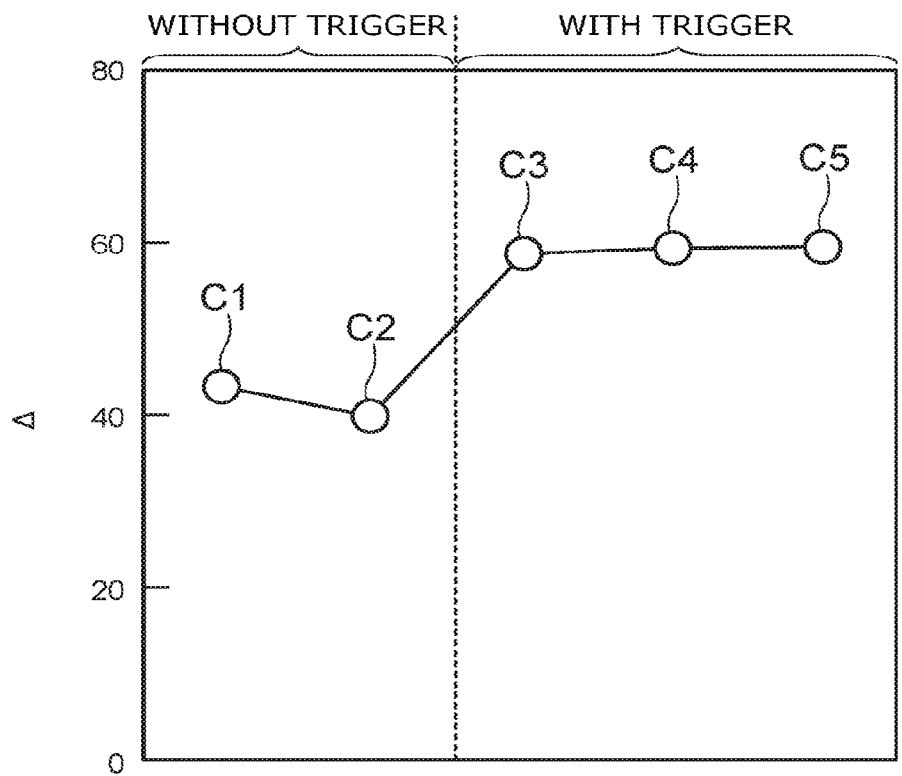
FIG. 8 is a graph showing a simulation result for the magnetic memory unit according to the first embodiment.

FIG. 8 is a graph illustrating the simulation results of the magnetic memory unit according to the first embodiment.

FIG. 8 shows the calculation results of the Δ value. In FIG. 8, C1 and C2 are the calculation results in the case where only the first portion 21 was provided in the second ferromagnetic layer 20. On the other hand, C3 to C5 are the calculation results in the case where the first portion 21 and the second portion 22 were provided in the second ferromagnetic layer 20. Also, C1 is the calculation result determined analytically from the material parameters of the first portion 21. C2 is the calculation result determined from the energy barrier in the case where only the first portion 21 was provided in the second ferromagnetic layer 20. C3 is the calculation result when the magnitude of the coupling magnetic field between the first portion 21 and the second portion 22 was set to 5 kOe. C4 is the calculation result when the magnitude of the coupling magnetic field between the first portion 21 and the second portion 22 was set to 6 kOe. C5 is the calculation result when the magnitude of the coupling magnetic field between the first portion 21 and the second portion 22 was set to 7 kOe.

As shown in FIG. 8, the Δ value is about 40 for the calculation result C1 and the calculation result C2. On the other hand, the Δ value is about 60 for the calculation results C3 to C5. Thus, it can be seen that the Δ value of the entirety is improved by providing the trigger layer. It can be seen that good thermal stability is obtained by providing the trigger layer.

Figure 9:
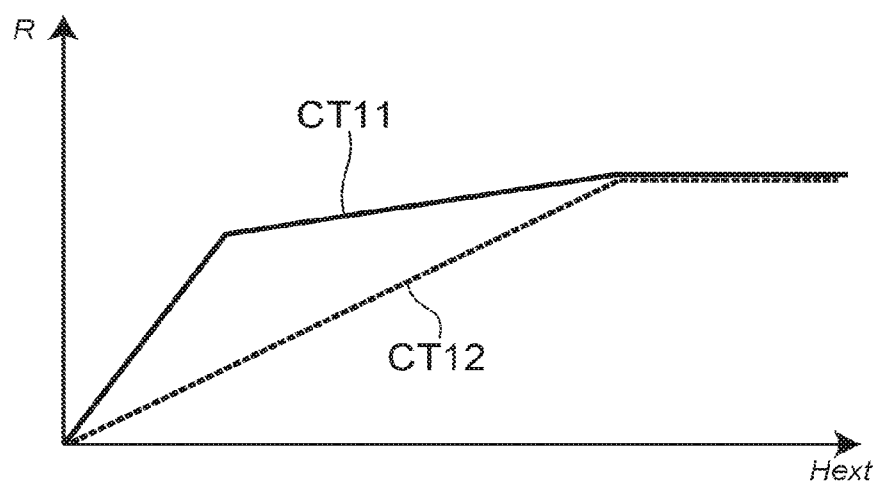
FIG. 9 is a graph showing a simulation result for the magnetic memory unit according to the first embodiment.

FIG. 9 is a graph illustrating simulation results of the magnetic memory unit according to the first embodiment.

FIG. 9 shows an example of the change of the resistance value of the magnetic memory unit MMU when an external magnetic field in the Z-axis direction is applied to the magnetic memory unit MMU. The horizontal axis of FIG. 9 is an external magnetic field Hext applied to the magnetic memory unit MMU; and the vertical axis is a resistance value R of the magnetic memory unit MMU.

For the magnetic memory unit, there is a configuration in which a portion called an interface layer is provided to be adjacent to the memory layer to increase the magnetoresistance effect. In particular, the case of the configuration shown in FIG. 6A, the position of the trigger layer is similar to the position where the interface layer is provided. The interface layer and the trigger layer are identifiable by observing the resistance change of the magnetic memory element for a magnetic field.

In FIG. 9, a characteristic CT11 illustrates the relationship between the external magnetic field Hext and the resistance value R of a magnetic memory unit having the configuration shown in FIG. 6A. A characteristic CT12 illustrates the relationship between the external magnetic field Hext and the resistance value R of a magnetic memory unit having a configuration in which the trigger layer of the configuration shown in FIG. 6A is replaced with an interface layer.

As shown in FIG. 9, in the case of the interface layer, the resistance value increases substantially uniformly up to the saturation magnetic field (Hk) because the interface layer and the memory layer respond to the magnetic field as one body. On the other hand, in the case of the trigger layer, the saturation magnetic field exists for each of the trigger layer and the memory layer because the trigger layer undergoes magnetization saturation first. Therefore, behavior is exhibited in which the tilt of the resistance value changes partway.

Figure 10:
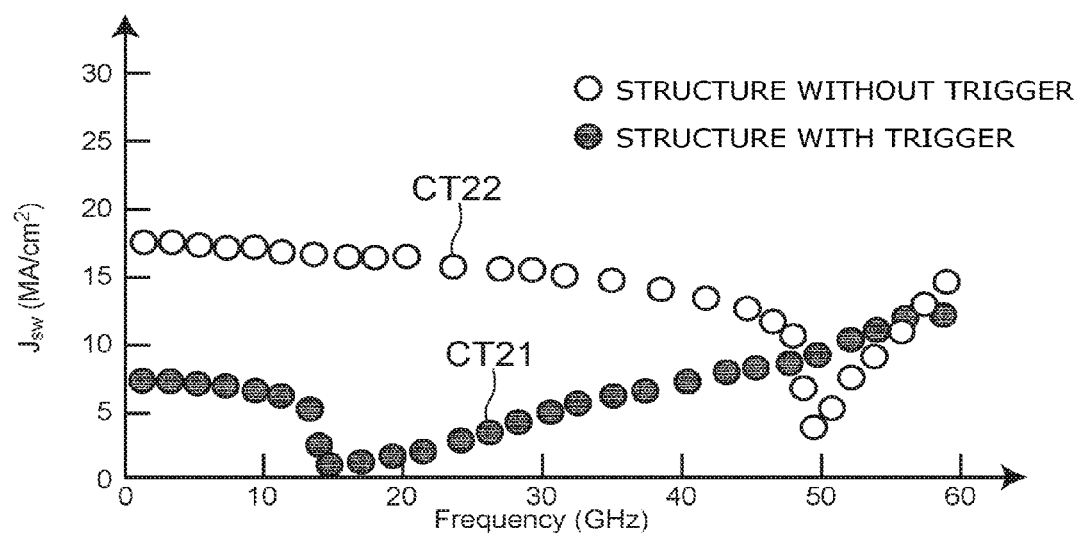
FIG. 10 is a graph showing the characteristics of the nonvolatile memory device according to the first embodiment.

FIG. 10 is a graph illustrating characteristics of the nonvolatile memory device according to the first embodiment.

FIG. 10 is a figure showing the change of the programming current for an external magnetic field for the case where there is a trigger layer and the case where there is no trigger layer in the second ferromagnetic layer 20. The horizontal axis of FIG. 10 is the frequency of the external magnetic field; and the vertical axis is the current density that was necessary for the magnetization reversal.

The magnetic resonance frequency (the third magnetic resonance frequency) of the second ferromagnetic layer 20 can be measured by, for example, causing probes to contact the upper and lower electrodes (e.g., the first conductive layer 81 and the second conductive layer 82) of the stacked body SB1 and by utilizing a damping measurement method. For example, the methods described in H. Kubota et. al., Nature physics 4 (08) 37, 3. Sankey et. al., Nature physics 4 (08) 67, etc., can be utilized as the damping measurement method.

In FIG. 10, a characteristic CT21 illustrates the result of the magnetic memory element 110 according to the embodiment. A characteristic CT22 illustrates the result of a reference example in which only the first portion 21 is provided in the second ferromagnetic layer 20.

As shown in FIG. 10, in the reference example in which the trigger layer is not provided, the magnetic resonance frequency of the second ferromagnetic layer 20 is in the vicinity of 50 GHz. On the other hand, in the magnetic memory element 110, the magnetic resonance frequency of the second ferromagnetic layer 20 is less than 20 GHz. Thus, it can be discriminated whether or not the trigger layer is provided in the second ferromagnetic layer 20 by, for example, measuring the magnetic resonance frequency of the second ferromagnetic layer 20 by utilizing a damping measurement method. The third magnetic resonance frequency lies between e.g. the first magnetic resonance frequency of the first portion 21 and the second magnetic resonance frequency of the second portion 22.

Figure 11:
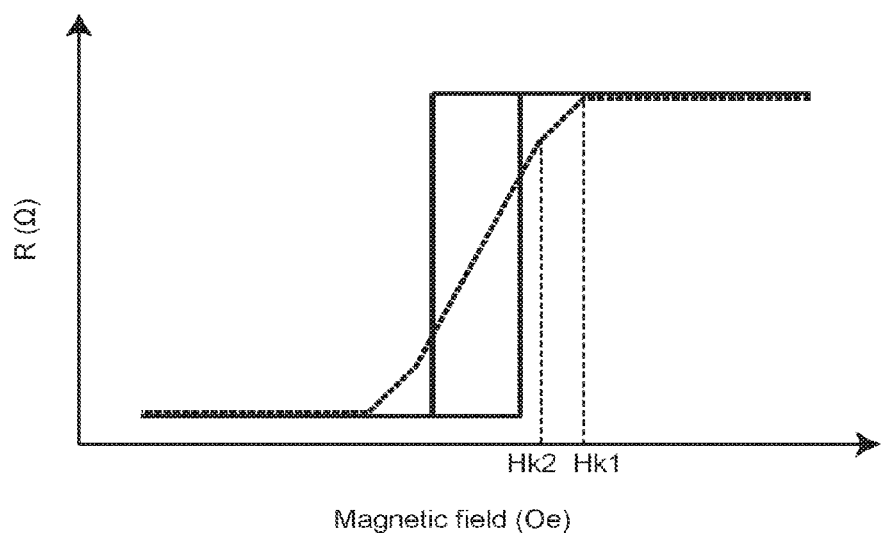
FIG. 11 is a graph showing the characteristics of the nonvolatile memory device according to the first embodiment.

FIG. 11 is a graph illustrating characteristics of the nonvolatile memory device according to the first embodiment.

FIG. 11 shows an example of the measurement results of the effective anisotropic magnetic field Hk1 of the first portion and the effective anisotropic magnetic field Hk2 of the second portion 22. The horizontal axis of FIG. 11 is the external magnetic field; and the vertical axis is the resistance value R of the magnetic memory unit.

The effective anisotropic magnetic field Hk1 of the first portion 21 and the effective anisotropic magnetic field Hk2 of the second portion 22 can be determined by, for example, causing probes to contact the upper and lower electrodes of the stacked body SB1 and by measuring the resistance of the magnetic memory unit when magnetic fields are applied to each of the easy axis direction and the hard axis direction. In the example, the easy axis direction is the stacking direction SD1; and the hard axis direction is the in-plane direction SD2.

As shown in FIG. 11, the effective anisotropic magnetic field Hk1 of the first portion 21 is, for example, the value of the magnetic field when the saturation magnetic field is reached. The effective anisotropic magnetic field Hk2 of the second portion 22 is, for example, the value of the magnetic field at the point where the tilt of the resistance value changes until the saturation magnetic field is reached.

Although it is desirable for the effective anisotropic magnetic field Hk1 of the first portion 21 to be separated from the effective anisotropic magnetic field Hk2 of the second portion 22, there are also cases where the effective anisotropic magnetic field Hk1 matches the effective anisotropic magnetic field Hk2. Also, although it is desirable for the squareness ratio to be 80% or more for the hysteresis loop in the easy axis direction, there are also cases where squareness is not formed.

Figure 12:
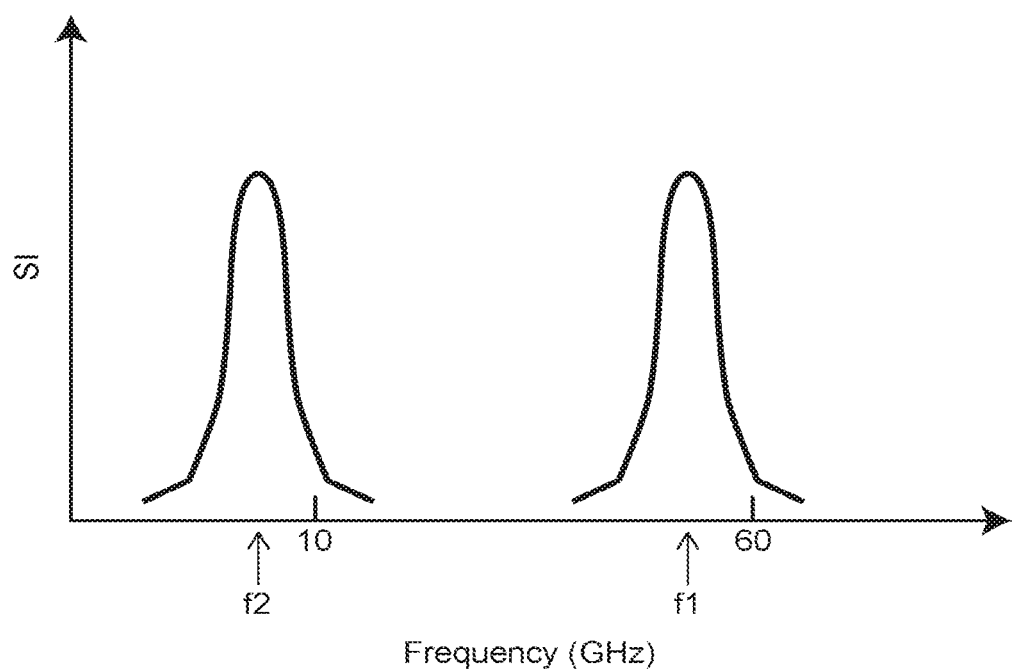
FIG. 12 is a graph showing the characteristics of the nonvolatile memory device according to the first embodiment.

FIG. 12 is a graph illustrating characteristics of the nonvolatile memory device according to the first embodiment.

FIG. 12 shows an example of the measurement results of the magnetic resonance frequency f1 of the first portion 21 and the magnetic resonance frequency f2 of the second portion 22. The horizontal axis of FIG. 12 is the measurement frequency of the measuring device; and the vertical axis is a signal strength SI of the measuring device.

The magnetic resonance frequency f1 of the first portion 21 and the magnetic resonance frequency f2 of the second portion 22 can be measured by, for example, using a ferromagnetic resonance (FMR: Ferromagnetic Resonance) measuring device, etc. For example, in the FMR measurement, probes are caused to contact the upper and lower electrodes of the stacked body SB1; and the spectra are measured. In the case where the first portion 21 and the second portion 22 are provided in the second ferromagnetic layer 20, two or more spectra corresponding respectively to the magnetic resonance frequency f1 of the first portion 21 and the magnetic resonance frequency f2 of the second portion 22 are observed. Thereby, one of the observed spectra can be measured as the magnetic resonance frequency f1 of the first portion 21; and one other of the observed spectra can be measured as the magnetic resonance frequency f2 of the second portion 22.

Also, for example, for the magnetic resonance frequency f1 of the first portion 21 and the magnetic resonance frequency f2 of the second portion 22, the materials included in the stacked body SB1 are identified by composition analysis using a combination of transmission electron microscopy (Transmission Electron Microscopy: TEM) and electron energy-loss spectroscopy (Electron Energy-Loss Spectroscopy: EELS), etc., and by making single-layer films using the materials corresponding to each portion. Then, the determination can be performed more accurately by measuring the magnetic resonance frequencies of the single-layer films using FMR measurement, etc.

Figure 13A:
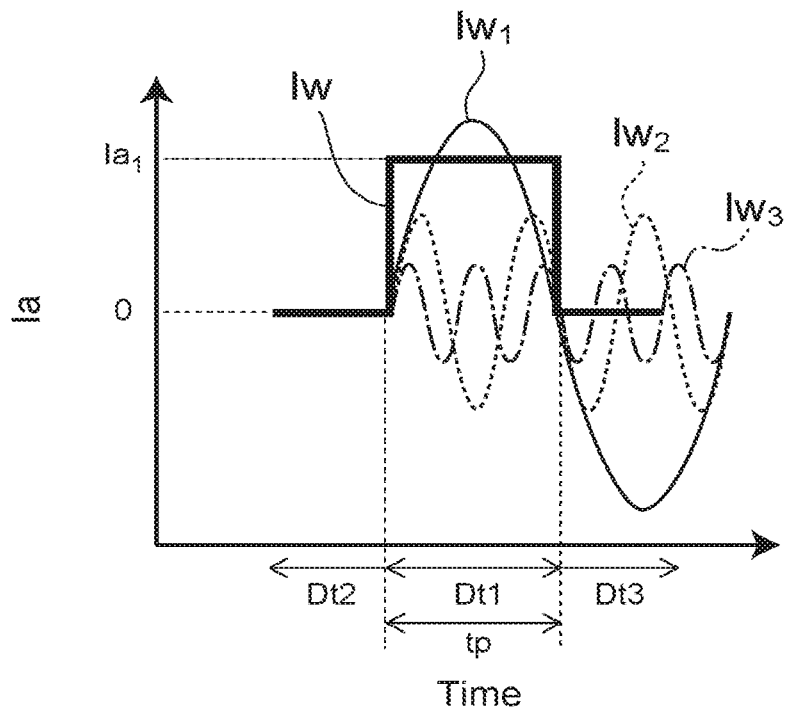
FIG. 13A and FIG. 13B are graphs showing the characteristics of the nonvolatile memory device according to the first embodiment.
Figure 13B:
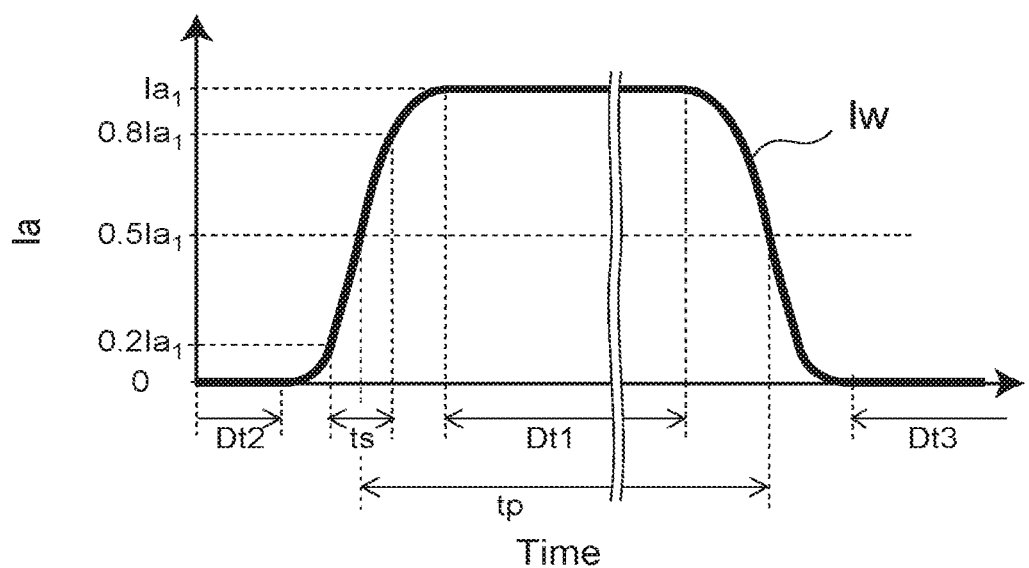

FIG. 13A and FIG. 13B are graphs illustrating the characteristics of the nonvolatile memory device according to the first embodiment.

FIGS. 13A and 13B illustrate the programming current Iw passed in the stacked body SB1 by the controller 550 of the nonvolatile memory device 610.

The horizontal axis of FIG. 13A and the horizontal axis of FIG. 13B represent time "Time". The vertical axis of FIG. 13A and the vertical axis of FIG. 13B represent the magnitude of the current Ia.

As shown in FIG. 13A, for instance, the programming current Iw is a single pulse current. For instance, the controller 550 causes the programming current Iw to flow in the stacked body SB1 in a first period Dt1.

For instance, the first period Dt1 is a period between a second period Dt2 and a third period Dt3. The third period Dt3 is a period after the second period Dt2. The controller 550 causes no current to flow in the stacked body SB1 in the second period Dt2 and the third period Dt3.

The magnitude of the programming current Iw is e.g. a first value $Ia_1$. For instance, the first period Dt1 is a period in which a current having a magnitude of the first value $Ia_1$ flows in the stacked body SB1.

The first value $Ia_1$ corresponds to the maximum current $Ia_m$ flowing in the stacked body SB1 between the second period Dt2 and the third period Dt3. The first value $Ia_1$ is e.g. substantially equal to the maximum $Ia_m$. The first value $Ia_1$ has a range of e.g. 0.9 times or more and 1.0 times or less of the maximum $Ia_m$. In other words, the first period Dt1 may be considered as a period in which a current of 0.9 times or more and 1.0 times or less of the maximum $Ia_m$ flows in the stacked body SB1.

For instance, the length of the first period Dt1 is substantially equal to the pulse width of the programming current Iw. The time between the second period Dt2 and the first period Dt1 (i.e., the rise time of the programming current Iw) is preferably short. That is, the programming current Iw is preferably a substantially rectangular wave.

For instance, the pulse width of the programming current Iw is tp seconds. In this case, the fundamental frequency of the programming current Iw is 1/tp. In the case where the programming current Iw is a rectangular wave, the programming current Iw includes a plurality of components as can be seen from the Fourier series expansion of the programming current Iw. For instance, the programming current Iw includes first to n-th components $Iw_1$-$Iw_n$, where "n" represents an integer of 1 or more.

For instance, the frequency of the n-th component $Iw_n$ is (2n−1)/tp. That is, the programming current Iw includes a component having a frequency of an odd multiple of 1/tp. For instance, in the case where the pulse width tp is 1 nanosecond, the programming current Iw includes a component having a frequency of 2n−1 GHz.

The amplitude $Aw_n$ of the n-th component $Iw_n$ is attenuated by e.g. a factor of 1/(2n−1) with respect to the amplitude of the first component.

Thus, the programming current Iw has high frequency components of odd multiples of 1/tp. Thereby, when the programming current Iw flows in the stacked body SB1, high frequency components are included and have action. The inventor of the application discovered that the magnitude of the programming current Iw can be reduced by the magnetic resonance effect when the frequency of a high frequency component and the magnetic resonance frequency of the second ferromagnetic layer 20 coincide.

In the embodiment, the length of the first period Dt1 is set so that the length of the first period T1 is an odd multiple of the reciprocal of the magnetic resonance frequency (the third magnetic resonance frequency) of the second ferromagnetic layer 20. For example, the length of the first period Dt1 (pulse width tp) is not less than 0.9 times and not more than 1.1 times the absolute value of an odd multiple of the reciprocal of the magnetic resonance frequency of the second ferromagnetic layer 20.

In the magnetic memory element 110 according to the embodiment, the trigger layer is provided as described above. Thereby, for example, the magnetic resonance frequency of the second ferromagnetic layer 20 can be reduced to about 10 GHz. In such a case, for example, when the pulse width of the programming current Iw is set to 1 nanosecond, the frequency of the fifth component of the programming current Iw is 9 GHz. Thus, by the programming current Iw having a high frequency component having a frequency near the magnetic resonance frequency of the ferromagnetic layer 20, the magnetic resonance effect occurs; and the magnitude of the programming current Iw can be reduced. Such a magnetic resonance effect enables a fast programming operation having a programming time of 3 nanoseconds or less.

For example, in the case where the pulse width is long, among the components of the programming current Iw, the amplitude of the component corresponding to the magnetic resonance frequency of the second ferromagnetic layer 20 is small. Therefore, there are cases where the magnetic resonance effect is small and the magnitude of the programming current Iw cannot be decreased.

In the embodiment, for example, the pulse width is set to 2 nanoseconds or less. For example, it is favorable for the pulse width to be 1 nanosecond or less.

FIG. 13B illustrates a graph in which FIG. 13A is enlarged along the horizontal axis. As shown in FIG. 13B, between the first period Dt1 and the second period Dt2, the programming current Iw rises toward the first value $Ia_1$. For instance, the rise time ts is defined as the time in which the programming current Iw rises from $0.2Ia_1$ to $0.8Ia_1$. As described above, the rise time ts is preferably short. For instance, the pulse width tp of the programming current Iw (pulse current) is defined as the time in which a current of 50% or more of the first value $Ia_1$ flows.

Figure 19:
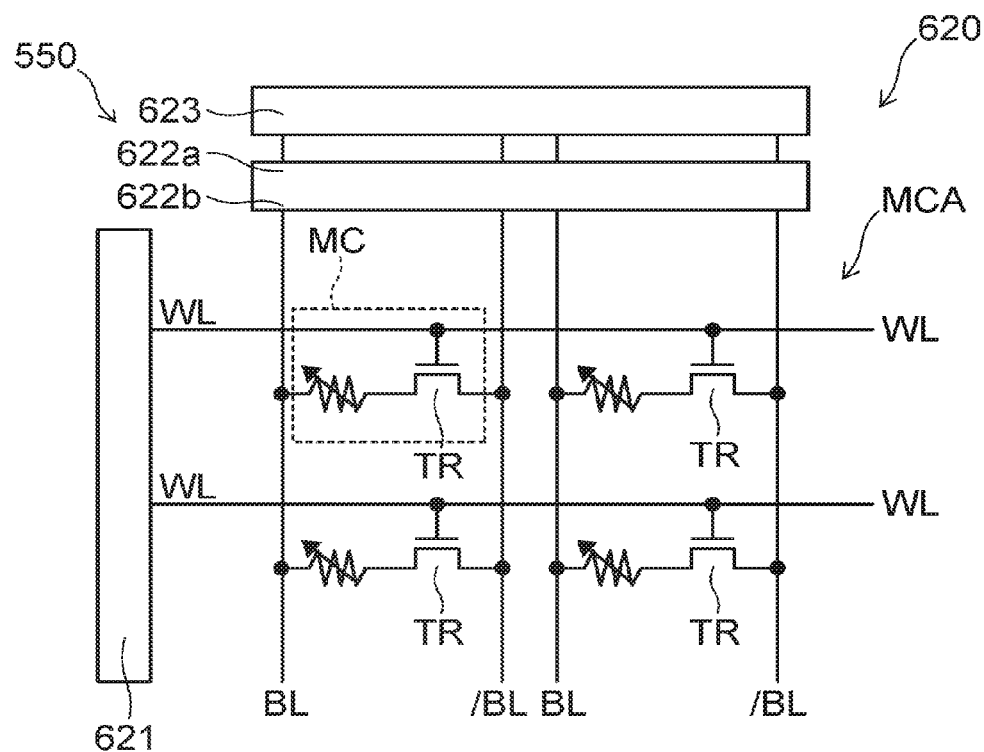
FIG. 19 is a schematic diagram showing the configuration of a nonvolatile memory device according to a second embodiment.

For instance, in a nonvolatile memory device based on a magnetic memory element, a plurality of magnetic memory elements are connected to one bit line BL (see FIG. 19). In the nonvolatile memory device, the rise time ts may be relatively long in the magnetic memory element placed at a position far from the driving circuit. That is, the waveform of the programming current Iw may be rounded in the magnetic memory element placed at a position far from the driving circuit.

If the rise time ts is long, the amplitude of the component of the programming current Iw corresponding to the magnetic resonance frequency of the second ferromagnetic layer 20 may be small. In this case, magnetization reversal is less likely to be assisted. Thus, the rise time ts is preferably short. Then, magnetization reversal is more likely to be assisted.

In the embodiment, the rise time ts is preferably e.g. less than 15%, and more preferably less than 10%, of the first period Dt1. For instance, in the case where the first period Dt1 is 2 nanoseconds, the rise time ts is preferably less than 300 picoseconds, and more preferably less than 200 picoseconds. In the case where the first period Dt1 is 1 nanosecond, the rise time ts is preferably less than 150 picoseconds, and more preferably less than 100 picoseconds.

For instance, in the nonvolatile memory device, the number of magnetic memory elements connected to one bit line BL is set to 256 or less. Then, the rise time ts can be made shorter (e.g., less than 10% of the pulse width). However, the number of magnetic memory elements connected to one bit line BL is preferably adjusted depending on the change of the parasitic capacitance of the bit line BL. For instance, the parasitic capacitance of the bit line BL changes with the miniaturization of the selection transistor and the structure of the selection transistor.

The number of applications installed on mobile terminals such as smartphones and tablet PCs has significantly increased in recent years. Such a trend incurs the increase of chip area and power consumption in conventional cache memories based on SRAM. For instance, such cache memories include e.g. L2 cache memories and L3 cache memories. For instance, such L2, L3 cache memories may be based on STT-MRAM (spin transfer torque magnetic random access memory). This can prevent leakage current, which causes problems in SRAM. For instance, the continual power consumption can be significantly reduced. STT-MRAM can rapidly switch the direction of magnetization by the current, and also has long memory retention time and high compatibility with CMOS circuits. It is considered that application of STT-MRAM to L2 cache memories and L3 cache memories requires a programming operation within a time of 3 nanoseconds or less.

For instance, in the case where the programming time is 3 nanoseconds or less, the behavior of magnetization reversal is described by the following equations.

[Formula 2]

$$I = \frac{e}{g} \cdot \frac{S}{\hbar} \cdot \ln\left\{\frac{-4f(a) \cdot \Delta}{\ln(P_{sw})}\right\} \cdot \frac{1}{t_p} + I_{c0} \quad (2)$$

[Formula 3]

$$f(a) = \left(\frac{2a}{a-1}\right)^{-\frac{2}{a+1}} \quad (3)$$

[Formula 4]

$$a = \frac{H_{est}}{H_u} + \left(1 - \frac{H_{ext}}{H_u}\right) \cdot \frac{I}{I_{c0}} \quad (4)$$

[Formula 5]

$$\tau_{sw}^{-1} = \frac{g(\theta)}{S} \cdot \frac{\hbar}{2} \cdot \frac{I - I_{c0}}{e} \quad (5)$$

[Formula 6]

$$S = \frac{M_s V}{\gamma} \quad (6)$$

[Formula 7]

$$I_{c0} = \frac{e}{g(\theta)} \cdot \frac{2S}{\hbar} \cdot \alpha \cdot \gamma \cdot (H_{ext} + H_u) \quad (7)$$

Here, g represents the spin injection efficiency, S represents the spin magnetic moment, Psw represents the reversal probability, Δ represents the magnitude of the energy potential, tp represents the pulse width, Hext represents the external application magnetic field (Oe), Hu represents the anisotropic magnetic field (Oe), α represents the damping constant, and γ represents the gyromagnetic ratio (MHz/Oe). $I_{c0}$ represents the threshold current for causing reversal in the adiabatic process. Equation (2) well represents the behavior in the case where $I/I_{c0}$ is 2 or more. Equation (2) means that the current required for writing significantly increases as the programming time (tp) becomes shorter.

In contrast, in the nonvolatile memory device 610 according to the embodiment, the magnetic resonance effect occurs between the high frequency component included in the programming current Iw and the magnetization of the second ferromagnetic layer 20. This can reduce the programming current Iw in the short programming time as envisioned in cache memories.

For example, in the case where the element is downscaled for a magnetic memory element in which the trigger layer is not provided, as described above, from the perspective of maintaining the thermal stability factor, it is difficult to reduce the magnetic resonance frequency of the second ferromagnetic layer 20. For example, in the case of a fine element in which the trigger layer is not provided, the magnetic resonance frequency of the second ferromagnetic layer 20 is 30 GHz or more. In the case where the pulse width of the programming current Iw is 1 nanosecond, the frequency of the fifteenth component of the programming current Iw is 29 GHz. Thus, among the components of the programming current Iw, the component corresponding to the magnetic resonance frequency of the second ferromagnetic layer 20 is a high-order component having a small amplitude. In such a case, for example, the magnetic resonance effect is small; and there are cases where the magnitude of the programming current Iw cannot be decreased.

In contrast, in the embodiment, the magnetic resonance frequency of the second ferromagnetic layer 20 is reduced by providing a trigger layer. Furthermore, programming is performed by a programming current Iw having a short pulse width. This facilitates the programming operation using a high frequency component of the programming current Iw. Furthermore, the magnetic resonance effect occurs between the pulse current and the magnetization of the second ferromagnetic layer 20. This can suppress the increase of the programming current.

Figure 14:
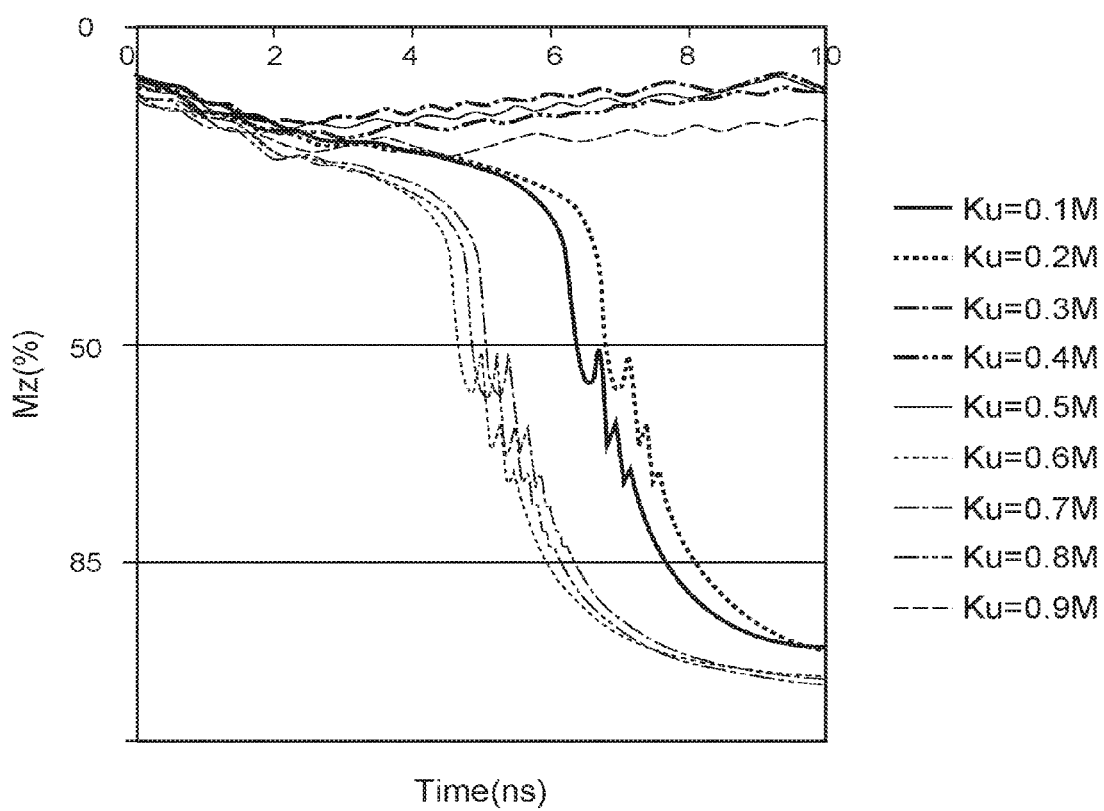
FIG. 14 is a graph showing the characteristics of the nonvolatile memory device according to the first embodiment.

FIG. 14 is a graph illustrating characteristics of the nonvolatile memory device according to the first embodiment.

FIG. 14 shows the results of a micromagnetic simulation. A configuration similar to the configuration described in regard to the magnetic memory element 110 is applicable to each of the magnetic memory elements for which the characteristics were calculated in the simulation.

In the simulation, the diameter of the element was set to 24 nm; the damping constant was set to 0.01; and the spin polarization was set to 0.6. In the first ferromagnetic layer 10, the thickness was set to 6 nm; the saturation magnetization Ms was set to 1000 emu/cc; and the effective magnetic anisotropy constant Ku was set to 8 Merg/cc. For the first portion 21, the thickness was set to 2 nm; the saturation magnetization Ms was set to 1000 emu/cc; and the effective magnetic anisotropy constant Ku was set to 6.5 Merg/cc. For the second portion 22, the thickness was set to 2 nm; and the saturation magnetization Ms was set to 1000 emu/cc.

The effective magnetic anisotropy constant Ku of the second portion 22 is different for each of the magnetic memory elements used in the simulation. In other words, the effective magnetic anisotropy constant Ku of the trigger layer was used as a parameter.

The horizontal axis of FIG. 14 is the time "Time" nanoseconds. The vertical axis of FIG. 14 is a magnetization state Mz of the second ferromagnetic layer 20. The magnetization state Mz is the change amount (%) of the magnetization of the second ferromagnetic layer 20. In the simulation, a pulse current was caused to flow in the magnetic memory element; and the relaxation process of the magnetization of the second ferromagnetic layer 20 was observed for 10 nanoseconds. At this time, the magnitude of the pulse current was set to 1.2 MA/cm$^2$; and the pulse width was set to 1 nanosecond. A pulse current was caused to flow for the time Time=0 to 1 nanosecond.

In the simulation, in the initial state of the time Time=0 nanoseconds, the orientation of the magnetization 10*m* of the first ferromagnetic layer 10 is antiparallel to the orientation of the magnetization 21*m* of the first portion 21 and the orientation of the magnetization 22*m* of the second portion 22.

When the orientation of the magnetization 10*m* of the first ferromagnetic layer 10 becomes parallel to the orientation of the magnetization 21*m* of the first portion 21 and the orientation of the magnetization 22*m* of the second portion 22, the magnetization state Mz (the change amount of the magnetization) becomes large compared to that of the initial state (the antiparallel state). In other words, in the example, the magnetization state Mz becomes large when the magnetization of the second ferromagnetic layer 20 reverses.

As shown in FIG. 14, it can be seen that there are cases where the magnetization of the second ferromagnetic layer 20 reverses due to the effective magnetic anisotropy constant Ku of the second portion 22 and cases where the magnetization of the second ferromagnetic layer 20 does not reverse due to the effective magnetic anisotropy constant Ku of the second portion 22.

Figure 15:
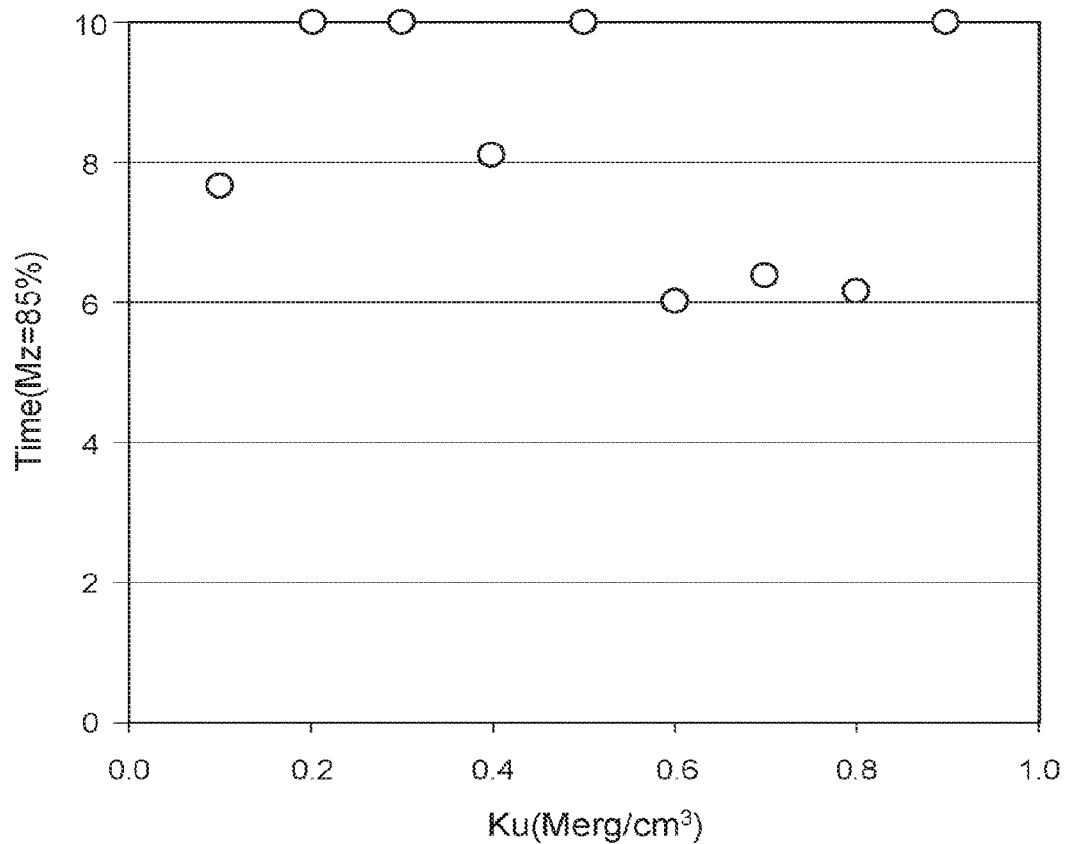
FIG. 15 is a graph showing the characteristics of the nonvolatile memory device according to the first embodiment.

FIG. 15 is a graph illustrating characteristics of the nonvolatile memory device according to the first embodiment.

FIG. 15 shows the results of the simulation described in regard to FIG. 14.

The horizontal axis of FIG. 15 is a parameter (the effective magnetic anisotropy constant Ku) of the simulation. The vertical axis of FIG. 15 is the time "Time" when the magnetization state Mz becomes 85% for the results shown in FIG. 14. The vertical axis of FIG. 15 corresponds to the reversal time of the magnetization of the second ferromagnetic layer 20.

The conditions that are plotted at 10 ns on the vertical axis of FIG. 15 mean that the reversal did not occur. For example, for the conditions of the effective magnetic anisotropy constant Ku being 0.2 and 0.3, the reversal did not occur. Conversely, for the conditions of the effective magnetic anisotropy constant Ku being 0.6 to 0.8, the reversal time is short. This means that for the conditions of the effective magnetic anisotropy constant Ku being 0.6 to 0.8, the magnetic resonance effect occurred between the oscillating magnetic field generated by the pulse current and the magnetization 21*m* and the magnetization 22*m*.

Thus, the magnetic resonance frequency can be reduced by providing the trigger layer; and programming using magnetic resonance assist can be performed. This can suppress the increase of the programming current and enable a fast programming operation in approximately 1 nanosecond. Also, even in the case where the magnetic memory element 110 is downscaled, the magnetic resonance frequency of the second ferromagnetic layer 20 can be reduced while maintaining the thermal stability factor by providing the trigger layer.

The examples of the configurations of each layer of the magnetic memory element 110 will now be described. The description recited below is applicable to any magnetic memory element according to the embodiment.

The first ferromagnetic layer 10 and the second ferromagnetic layer 20 may include, for example, a metal material including at least one element selected from the group consisting of iron (Fe), cobalt (Co), nickel (Ni), manganese (Mn), and chrome (Cr). Further, an alloy including the at least one selected from the group recited above and at least one metal selected from the group consisting of platinum (Pt), palladium (Pd), iridium (Ir), ruthenium (Ru), and rhodium (Rh) can be used.

For the first ferromagnetic layer 10 and the second ferromagnetic layer 20, the composition of the magnetic materials that are included, the conditions of the heat treatment, etc., are adjusted. Thereby, for the first ferromagnetic layer 10 and the second ferromagnetic layer 20, for example, characteristics such as the magnetization amount, the magnetic anisotropy, etc., can be adjusted. For example, the first portion 21 and the second portion 22 can be formed in the second ferromagnetic layer 20. Also, the first ferromagnetic layer 10 and the second ferromagnetic layer 20 may include, for example, a rare earth-transition metal amorphous alloy such as TbFeCo, GdFeCo, etc. The first ferromagnetic layer 10 and the second ferromagnetic layer 20 may include, for example, a stacked structure of Co/Pt, Co/Pd, Co/Ni, etc. Co/Ru, Fe/Au, Ni/Cu, etc., are used as perpendicular magnetization films by combining with a foundation layer. Co/Ru, Fe/Au, Ni/Cu, etc., can be used as the first ferromagnetic layer 10 and the second ferromagnetic layer 20 by controlling the crystal orientation direction of the film. The first ferromagnetic layer 10 and the second ferromagnetic layer 20 may include, for example, an additive such as aluminum (Al), germanium (Ge), nitrogen (N), phosphorus (P), arsenic (As), boron (B), silicon (Si), etc.

At least one selected from the group consisting of the first portion 21 and the second portion 22 may include, for example, a Heusler alloy. The Heusler alloy is, for example, an alloy that has an $L2_1$ structure and a composition such as $X_2YZ$. In such a case, at least one selected from the group consisting of the first portion 21 and the second portion 22 includes, for example, a Heusler alloy including at least one selected from the group consisting of Co, Mn, Fe, Ni, Cu, Rh, Ru, and Pd.

For example, the first portion 21 and the second portion 22 include a first Heusler alloy. The first Heusler alloy includes at least one selected from the group consisting of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

By the second portion 22 including the first Heusler alloy recited above, for example, the saturation magnetization Ms of the second portion 22 can be increased. Thereby, for example, the magnetic resonance frequency of the second ferromagnetic layer 20 can be reduced; and the magnetic resonance effect can occur easily.

For example, the first portion 21 and the second portion 22 may include a second Heusler alloy. The second Heusler alloy includes at least one selected from the group consisting of $Co_2HfSn$, $Co_2ZrSn$, $Co_2HfAl$, $Co_2ZrAl$, $CO_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The relative saturation magnetization Ms is small for the second Heusler alloy recited above. For example, Ms<400 emu/cc is possible. Thereby, for example, the leakage magnetic field into the adjacent magnetic memory element can be reduced.

In the embodiment, the Heusler alloy described above may be included in one of the first portion 21 or the second portion 22; or the Heusler alloy described above may be included in both the first portion 21 and the second portion 22. It is desirable for the second Heusler alloy to be included in the first portion 21. Thereby, for example, the leakage magnetic field into the surrounding elements can be suppressed. It is desirable for the first Heusler alloy to be included in the second portion 22. Thereby, for example, the magnetic resonance frequency of the second ferromagnetic layer 20 can be reduced.

The first nonmagnetic layer 10n may include, for example, an insulating material that functions as a nonmagnetic tunneling barrier layer. Specifically, for example, an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) can be used. For example, the nonmagnetic tunneling barrier layer is a nonmagnetic layer that includes an insulator and has a current (a tunneling current) flowing due to tunneling when a voltage is applied. For example, the thickness of the nonmagnetic tunneling barrier layer is 2 nm or less. Thereby, the tunneling current flows in the nonmagnetic tunneling barrier layer when the voltage is applied.

The first nonmagnetic layer 10n may include, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, etc. The first nonmagnetic layer 10n may include, for example, a nonmagnetic semiconductor (ZnOx, InMn, GaN, GaAs, TiOx, Zn, Te, or a substance in which a transition metal is doped into these nonmagnetic semiconductors), etc.

It is desirable for the thickness of the first nonmagnetic layer 10n to have a value in a range of not less than about 0.2 nanometers (nm) and not more than about 2.0 nm. Thereby, for example, an excessively high resistance is suppressed while ensuring the uniformity of the insulating film.

The first conductive layer 81 and the second conductive layer 82 include, for example, a conductive magnetic material or a conductive nonmagnetic material. For example, a magnetic metal including at least one element selected from the group consisting of iron (Fe), cobalt (Co), nickel (Ni), manganese (Mn), and chrome (Cr) can be used as the conductive magnetic material. Further, an alloy including the at least one selected from the group recited above and at least one element selected from the group consisting of platinum (Pt), palladium (Pd), iridium (Ir), ruthenium (Ru), and rhodium (Rh) may be used.

The conductive nonmagnetic material included in the first conductive layer 81 and the second conductive layer 82 may include, for example, one metal selected from the group consisting of gold (Au), copper (Cu), chrome (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al), or an alloy including two or more metals selected from the group recited above.

Further, the conductive nonmagnetic material included in the first conductive layer 81 and the second conductive layer 82 may be at least one selected from the group consisting of a conductive nitride, a conductive oxide and a conductive fluoride including at least one element selected from the group recited above. The conductive nonmagnetic material included in the first conductive layer 81 and the second conductive layer 82 may be a carbon nanotube, a carbon nanowire, graphene, etc.

A conductive protective film may be provided in the first conductive layer 81 and the second conductive layer 82. In such a case, the protective film may include, for example, an alloy including at least one element selected from the group consisting of tantalum (Ta), ruthenium (Ru), copper (Cu), gold (Au), silver (Ag), aluminum (Al), copper (Cu), gold (Au), silver (Ag), and aluminum (Al), a material such as graphene, etc. Considering electromigration resistance and low resistance, it is desirable for the protective film to include one element selected from the group consisting of copper (Cu) and aluminum (Al), or an alloy including these elements.

There are cases where a transistor is connected directly or indirectly to at least one selected from the group consisting of the first conductive layer 81 and the second conductive layer 82. In such a case, the at least one selected from the group consisting of the first conductive layer 81 and the second conductive layer 82 recited above may include, for example, a source portion or a drain portion of the transistor.

Also, in such a case, at least one selected from the group consisting of the first conductive layer 81 and the second conductive layer 82 recited above may include, for example, a contact portion connected to the source portion or the drain portion of the transistor.

The configuration of the stacked body SB1 when projected onto the X-Y plane is arbitrary. The configuration of the stacked body SB1 when projected onto the X-Y plane is, for example, a circle, an ellipse, a flattened circle, a polygon, etc. In the case of the polygon, it is favorable to have three or more corners such as a quadrilateral, a hexagon, etc. Also, the polygon may have a rounded-corner configuration.

The configuration of the stacked body SB1 when projected onto a plane (e.g., the Z-X plane or the Z-Y plane) parallel to the Z-axis is arbitrary. The configuration of the stacked body SB1 when projected onto the plane parallel to the Z-axis (the configuration when cut by a plane perpendicular to the film surface) can be, for example, a tapered configuration or a reverse-tapered configuration.

An example of a method for manufacturing the magnetic memory element 110 according to the first embodiment will now be described. In addition to the magnetic memory element 110, the manufacturing method recited below is applicable also to other magnetic memory elements described below according to the embodiment by appropriately modifying the order of making the layers. Also, in the following description, "material A/material B" indicates that material B is stacked on material A.

After forming a lower electrode (not shown) on a wafer, the wafer is disposed inside an ultra high vacuum sputtering apparatus. Ta/Ru (as a stopper layer and a contact layer for the lower electrode), an FePt/CoFeB layer (the first ferromagnetic layer 10), MgO (the first nonmagnetic layer 10$n$), a CoFeB layer (a trigger layer), and a CoFeB/FePd layer (a memory layer) are stacked in this order on the lower electrode. Here, by annealing in a magnetic field, the strength of the magnetic anisotropy in the film surface perpendicular direction also can be adjusted for the CoFeB layer and the CoFeB/FePd layer. Continuing, a Ru/Ta layer (an upper contact layer) is stacked. Thereby, the patterning body is formed.

Then, a resist mask having a diameter of 50 nm is formed by coating an EB (electron beam: electron beam) resist and performing EB exposure. The portions of the patterning body not covered with the resist are cut away by ion milling until the Ta layer of the stopper layer/contact layer with the lower electrode is exposed.

Subsequently, a SiN film that is used to form a protective insulating layer is formed to cover the stacked body SB1.

Then, after forming a $SiO_2$ film used to form a burying insulating layer, the upper contact layer for the electrode is exposed by etching the entire surface using RIE (Reactive Ion Etching), etc., after planarizing by CMP (Chemical Mechanical Polishing), etc.

Further, a resist is coated onto the entire surface; and the resist is patterned using a stepper lithography apparatus so that the opening of the resist corresponds to the position of the upper electrode. A Cu film is formed to fill the opening corresponding to the upper electrode; and the resist is removed. Thereby, the upper electrode is formed. An interconnect (not shown) that is electrically connected to the upper electrode is provided.

Thereby, the magnetic memory element 110 is completed.

Figure 16:
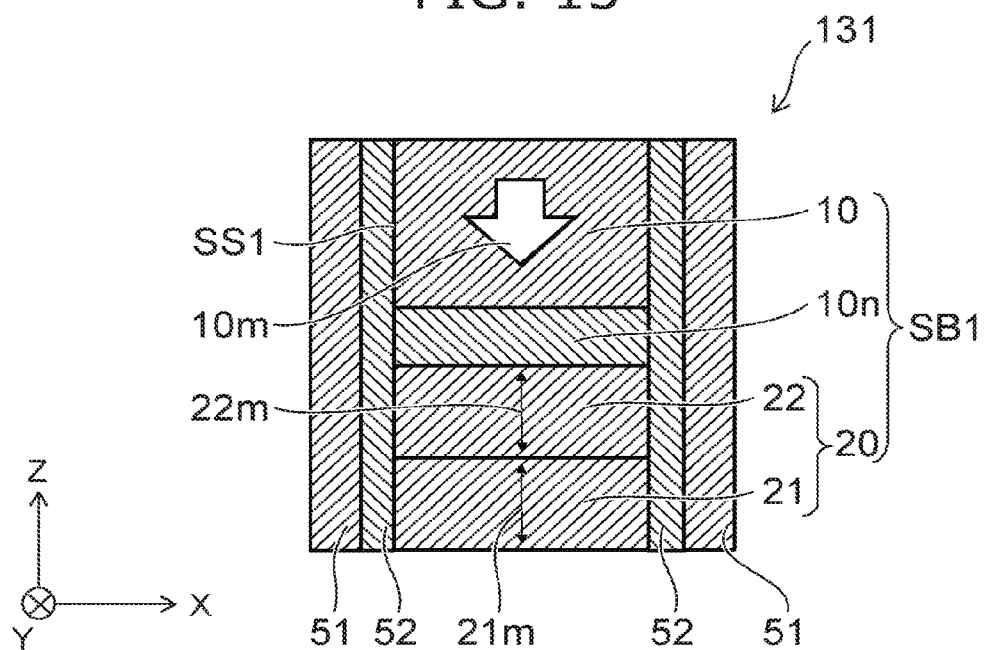
FIG. 16 is a schematic sectional view showing an alternative nonvolatile memory device according to the first embodiment.

FIG. 16 is a schematic cross-sectional view illustrating another nonvolatile memory device according to the first embodiment.

As shown in FIG. 16, a magnetic memory element 131 further includes a magnetic shield 51. The stacked body SB1 has a side surface SS1 (a first side surface) extending in the stacking direction SD1. Here, "extending in the stacking direction SD1" includes the state of being non-parallel to the stacking direction SD1. It is sufficient for "extending in the stacking direction SD1" to have at least a component extending in the stacking direction SD1. In other words, it is sufficient for a "surface extending in the stacking direction SD1" to not be a surface orthogonal to the stacking direction SD1.

The magnetic shield 51 covers at least a portion of the side surface 551 of the stacked body SB1. In other words, the magnetic shield 51 opposes at least a portion of the side surface SS1 of the stacked body SB1. In the example, the magnetic shield 51 covers the side surface SS1. The configuration of the magnetic shield 51 projected onto the X-Y plane is, for example, an annular configuration provided around the stacked body SB1.

The magnetic memory element 131 further includes a protective layer 52 provided between the magnetic shield 51 and the side surface SS1 of the stacked body SB1. For example, it is desirable for the thickness of the protective layer 52 to be not less than 2 nm and not more than 30 nm.

For example, the side surface SS1 of the stacked body SB1 is covered with the magnetic shield 51 of permalloy (Py), etc., with the protective layer 52 of SiN, $Al_2O_3$, etc., interposed. Thereby, for example, in the case where multiple magnetic memory elements 131 are arranged, negative effects on the operation of the stacked body SB1 due to the leakage magnetic field from the adjacent magnetic memory element 131 are suppressed. For example, for each memory cell (stacked body SB1), the fluctuation of the reversal current between bits is suppressed because the effective magnetic field acting on the stacked body SB1 is substantially the same. Also, the leakage magnetic field from the stacked body SB1 acting on the adjacent magnetic memory element can be suppressed. As a result, the multiple magnetic memory elements can be disposed to be proximal; and the integration can be increased. For example, the bit density of the nonvolatile memory device can be increased.

The magnetic shield 51 includes, for example, one metal selected from the group consisting of iron (Fe), cobalt (Co), nickel (Ni), manganese (Mn), and chrome (Cr), or an alloy including two or more metals selected from the group. The magnetic shield 51 may be, for example, an alloy including at least one metal selected from the group consisting of iron (Fe), cobalt (Co), nickel (Ni), manganese (Mn), and chrome (Cr) and at least one metal selected from the group consisting of platinum (Pt), palladium (Pd), iridium (Ir), ruthenium (Ru), and rhodium (Rh).

The characteristics of the magnetic shield 51 can be adjusted by adjusting the composition of the magnetic material included in the magnetic shield 51 or the conditions of the heat treatment. The magnetic shield 51 may be, for example, a rare earth-transition metal amorphous alloy such as TbFeCo, GdFeCo, etc. Also, the magnetic shield 51 may have a stacked structure such as Co/Pt, Co/Pd, Co/Ni, etc.

The protective layer 52 may include, for example, an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). The protective layer 52 includes, for example, SiN.

An example of the method for manufacturing the magnetic memory element 131 shown in FIG. 16 will now be described.

After forming a lower electrode (not shown) on a wafer, the wafer is disposed inside an ultra high vacuum sputtering apparatus. Ta/Ru (as a stopper layer and a contact layer for the lower electrode), an FePt/CoFeB layer (the first ferromagnetic layer 10), MgO (the first nonmagnetic layer 10n), a CoFeB layer (a trigger layer), and a CoFeB/FePd layer (a memory layer) are stacked in this order on the lower electrode. Here, the strength of the magnetic anisotropy in the film surface perpendicular direction also can be adjusted for the CoFeB layer and the CoFeB/FePd layer by annealing in a magnetic field. Continuing, a Ru/Ta layer (an upper contact layer) is stacked. Thereby, the patterning body is formed.

Then, a resist mask having a diameter of 30 nm is formed by coating an EB resist and performing EB exposure. The portions not covered with the resist are cut away by ion milling until the Ta layer on the lower electrode also used as the stopper layer is exposed.

Continuing, a Py layer that functions as the magnetic shield 51 is formed after forming a SiN layer as the protective layer 52. Etch-back is performed so that the Py layer remains on the side wall of the magnetic memory element.

Then, after forming a $SiO_2$ film to insulatively bury the magnetic memory element, the contact layer for the electrode is exposed by etching the entire surface by RIE, etc., after planarizing by CMP, etc.

Further, a resist is coated onto the entire surface; and the resist is patterned using a stepper lithography apparatus so that a portion not covered with the resist is made at the position of the upper electrode. Cu is formed as a film by filling into the opening corresponding to the upper electrode; and the resist is removed. Electrical input/output is made possible by providing a not-shown interconnect for the upper electrode.

Thereby, the magnetic memory element 131 is completed.

Figure 17A:
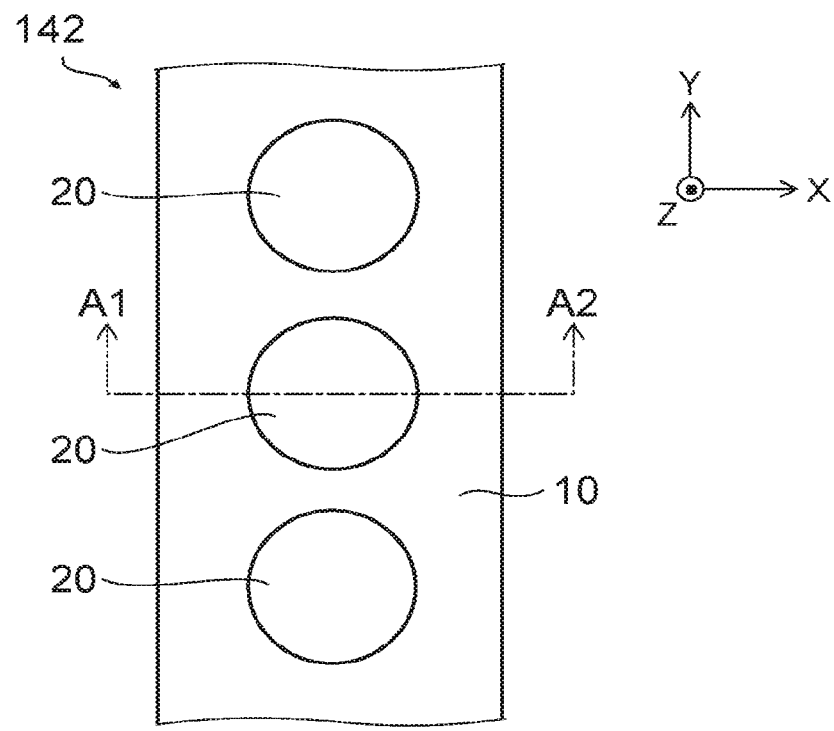
FIG. 17A and FIG. 17B are schematic views showing an alternative nonvolatile memory device according to the first embodiment.
Figure 17B:
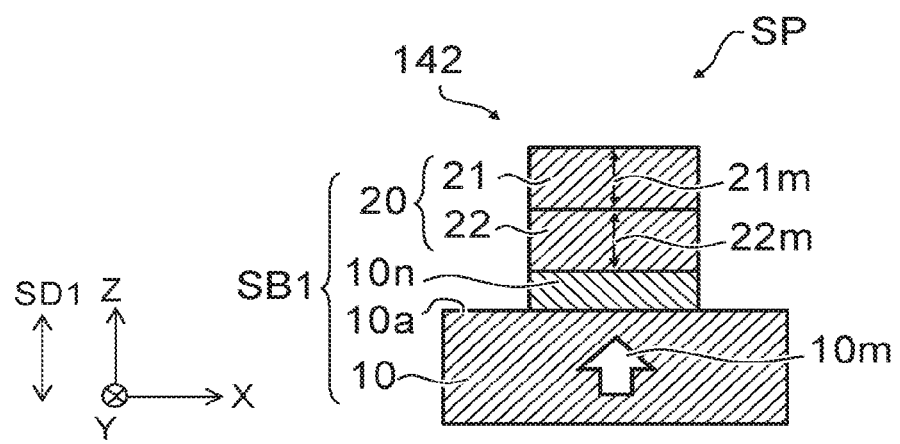

FIG. 17A and FIG. 17B are schematic views illustrating another nonvolatile memory device according to the first embodiment.

FIG. 17A is a schematic plan view of a magnetic memory element 142; and FIG. 17B is a schematic cross-sectional view of the magnetic memory element 142. FIG. 17B schematically shows a line A1-A2 cross section of FIG. 17A.

In the magnetic memory element 142 as shown in FIG. 17A and FIG. 17B, the second ferromagnetic layer 20 is multiply provided; and the first nonmagnetic layer 10n is multiply provided. The multiple second ferromagnetic layers 20 are arranged in a direction perpendicular to the stacking direction SD1. In the example, the multiple second ferromagnetic layers 20 are arranged in the Y-axis direction. The multiple first nonmagnetic layers 10n are provided respectively between the first ferromagnetic layer 10 and each of the multiple second ferromagnetic layers 20. In the magnetic memory element 142, the multiple first nonmagnetic layers 10n are provided to be arranged on the first ferromagnetic layer 10.

In the magnetic memory element 142, the first ferromagnetic layer 10 is large compared to the second ferromagnetic layer 20. Thereby, for example, the leakage magnetic field caused by the magnetization 10m of the first ferromagnetic layer 10 at the position of the second ferromagnetic layer 20 can be reduced.

Figure 18A:
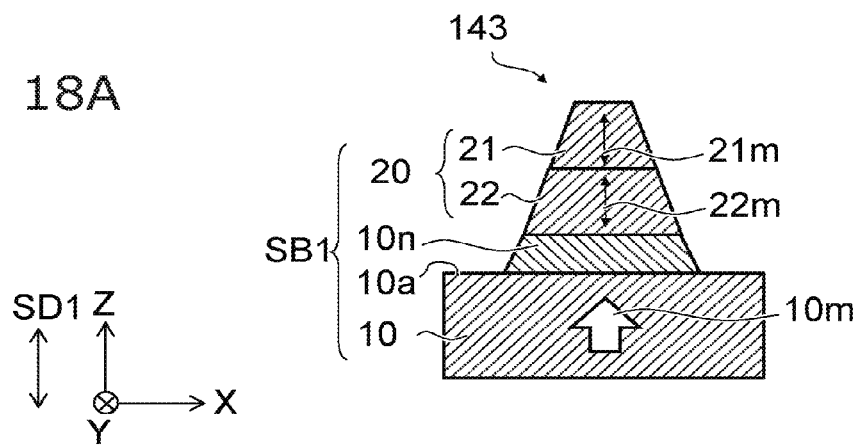
FIG. 18A to FIG. 18C are schematic sectional views showing nonvolatile alternative memory devices according to the first embodiment.
Figure 18B:
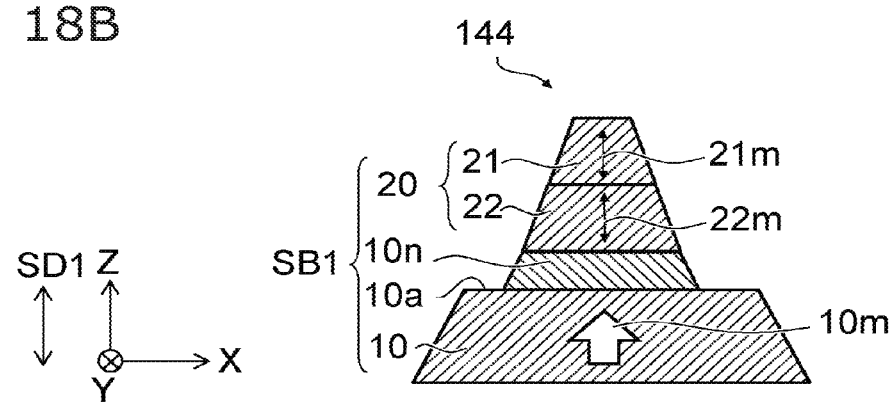
Figure 18C:
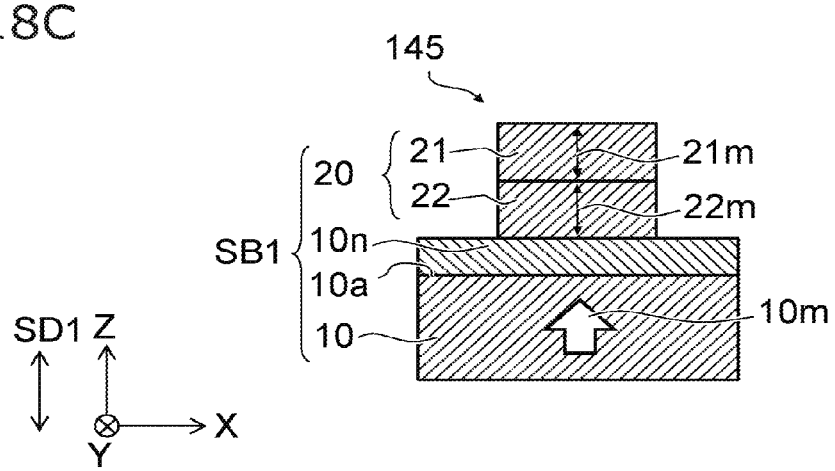

FIG. 18A to FIG. 18C are schematic cross-sectional views illustrating other nonvolatile memory devices according to the first embodiment.

In a magnetic memory element 143 as shown in FIG. 18A, a stacked portion SP is provided on the first ferromagnetic layer 10. In the example, the stacked portion SP includes one of the multiple second ferromagnetic layers 20, and one first nonmagnetic layer 10n stacked with the one second ferromagnetic layer 20. In the magnetic memory element 143, the width (the length in a direction perpendicular to the stacking direction SD1) of the stacked portion SP decreases in the direction from the first ferromagnetic layer 10 toward the second ferromagnetic layer 20. For example, the width of the stacked portion SP decreases continuously.

In the example, the width of the stacked portion SP decreases continuously in the upward direction. In other words, the configuration of the stacked portion SP is a tapered configuration. The configuration of the stacked portion SP is, for example, a truncated pyramid configuration. The configuration of the second ferromagnetic layer 20, etc., projected onto the X-Y plane is, for example, a circle. Accordingly, the configuration of the stacked portion SP is, for example, a truncated circular conical configuration. Accordingly, in the example, the length in the direction perpendicular to the stacking direction SD1 of each of the multiple second ferromagnetic layers 20 is shorter than the length in the direction perpendicular to the stacking direction SD1 of each of the multiple first nonmagnetic layers 10n. In the example, the length in the direction perpendicular to the stacking direction SD1 of the first portion 21 is shorter than the length in the direction perpendicular to the stacking direction SD1 of the second portion 22.

In a magnetic memory element 144 as shown in FIG. 18B, the width (the length in the direction perpendicular to the stacking direction SD1) of the first ferromagnetic layer 10 decreases in the direction from the first ferromagnetic layer 10 toward the second ferromagnetic layer 20. For example, the width of the first ferromagnetic layer 10 decreases continuously. In the example, the width of the first ferromagnetic layer 10 decreases continuously in the upward direction. In other words, the configuration of the first ferromagnetic layer 10 is a tapered configuration. The configuration of the first ferromagnetic layer 10 is, for example, a truncated pyramid configuration. Thus, the configuration of the first ferromagnetic layer 10 may be a tapered configuration.

In a magnetic memory element 145 as shown in FIG. 18C, one first nonmagnetic layer 10n is provided between the first ferromagnetic layer 10 and multiple second ferromagnetic layers 20. In the magnetic memory element 145, the first nonmagnetic layer 10n is provided on the first ferromagnetic layer 10. The multiple second ferromagnetic layers 20 are provided to be arranged on the first nonmagnetic layer 10n. In the example, the stacked portion SP includes the multiple second ferromagnetic layers 20.

Thus, in the configuration in which the multiple stacked portions SP are stacked on the one first ferromagnetic layer 10, the first nonmagnetic layer 10n may be multiply provided respectively between the first ferromagnetic layer 10 and each of the second ferromagnetic layers 20; or one first nonmagnetic layer 10n may be provided between the first ferromagnetic layer 10 and the multiple second ferromagnetic layers 20. In the magnetic memory element 145, the configuration of the first nonmagnetic layer 10n may be a tapered configuration; and the configuration of the second ferromagnetic layer 20 may be a tapered configuration.

(Second Embodiment)

FIG. 19 is a schematic view illustrating a configuration of a nonvolatile memory device according to a second embodiment.

As shown in FIG. 19, the nonvolatile memory device 620 according to the embodiment includes a memory cell array MCA. The memory cell array MCA includes multiple memory cells MC arranged in a matrix configuration. Each of the memory cells MC includes one of the magnetic memory elements according to the first embodiment as the MTJ element (the stacked body SB1).

Multiple bit line pairs (bit lines BL and bit lines/BL) and multiple word lines WL are disposed in the memory cell array MCA. Each of the multiple bit line pairs extends in the column (column) direction. Each of the multiple word lines WL extends in the row (row) direction.

The memory cells MC are disposed at the intersections between the bit lines BL and the word lines WL. Each of the memory cells MC includes a MTJ element and a selection transistor TR. One end of the MTJ element is connected to the bit line BL. The other end of the MTJ element is connected to the drain terminal of the selection transistor TR. The gate terminal of the selection transistor TR is connected to the word line WL. The source terminal of the selection transistor TR is connected to the bit line/BL.

A row decoder 621 is connected to the word lines WL. A program circuit 622a and a read-out circuit 622b are connected to the bit line pairs (the bit lines BL and the bit lines/BL). A column decoder 623 is connected to the program circuit 622a and the read-out circuit 622b.

Each of the memory cells MC is selected by the row decoder 621 and the column decoder 623. An example of the data programming to the memory cells MC is as follows. First, to select the memory cell MC for which the data programming is to be performed, the word line WL that is connected to the memory cell MC is activated. Thereby, the selection transistor TR is switched ON.

In the example, for example, the controller 550 includes the row decoder 621, the program circuit 622a, the read-out circuit 622b, and the column decoder 623. The controller 550 is electrically connected to each of the multiple memory cells MC (the multiple magnetic memory elements) via the bit line BL, the word line WL, the selection transistor TR, etc. The controller 550 implements the programming of the data and the reading of the data to and from each of the multiple memory cells MC.

For example, a bidirectional programming current is supplied to the MTJ element. Specifically, in the case where the programming current is supplied to the MTJ element from left to right, the program circuit 622a applies a positive potential to the bit line BL and applies a ground potential to the bit line/BL. Also, in the case where the programming current is supplied to the MTJ element from right to left, the program circuit 622a applies a positive potential to the bit line/BL and applies the ground potential to the bit line BL. Thus, the datum "0" or the datum "1" can be programmed to the memory cell MC.

An example of the data read-out from the memory cell MC is as follows. First, the memory cell MC is selected. For example, the read-out circuit 622b supplies, to the MTJ element, a read-out current flowing in the direction from the selection transistor TR toward the MTJ element. Then, the read-out circuit 622b senses the resistance value of the MTJ element based on the read-out current. Thus, the information that is stored in the MTJ element can be read.

Figure 20:
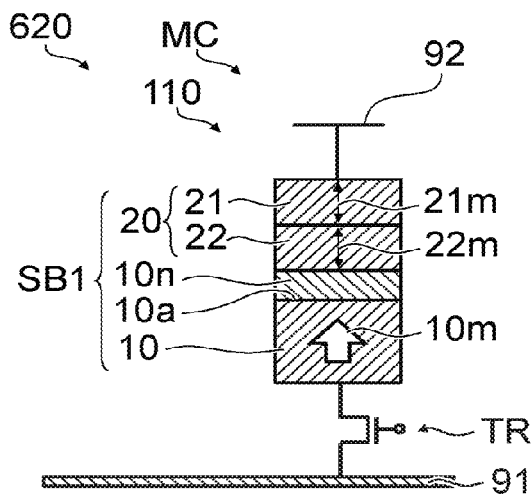
FIG. 20 is a schematic view showing the configuration of the nonvolatile memory device according to the second embodiment.

FIG. 20 is a schematic view illustrating the configuration of the nonvolatile memory device according to the second embodiment.

FIG. 20 shows a portion of one memory cell MC. Although the magnetic memory element 110 is used in the example, any magnetic memory element according to the embodiment can be used.

As shown in FIG. 20, the nonvolatile memory device 620 includes the magnetic memory element according to the embodiment (e.g., the magnetic memory element 110), the first interconnect 91, and the second interconnect 92. The first interconnect 91 is connected directly or indirectly to one end (e.g., the first ferromagnetic layer 10 end) of the magnetic memory element 110. The second interconnect 92 is connected directly or indirectly to the other end (e.g., the second ferromagnetic layer 20 end) of the magnetic memory element 110.

Here, being "connected directly" includes the state of being electrically connected without another conductive member (e.g., a via electrode, an interconnect, etc.) inserted therebetween. Being "connected indirectly" includes the state of being electrically connected with another conductive member (e.g., a via electrode, an interconnect, etc.) inserted therebetween, and the state of being connected in a state in which a switch (e.g., a transistor or the like) is inserted therebetween and the conduction and non-conduction are changeable.

For example, one of the first interconnect 91 or the second interconnect 92 corresponds to the bit line BL or the bit line/BL. For example, the other of the first interconnect 91 or the second interconnect 92 corresponds to the bit line BL or the bit line/BL.

As shown in FIG. 20, the nonvolatile memory device 620 can further include the selection transistor TR. The selection transistor TR is provided between the magnetic memory element 110 and the first interconnect 91 (a first position) and/or between the magnetic memory element 110 and the second interconnect 92 (a second position).

By such a configuration, the data can be programmed to any memory cell MC (e.g., any magnetic memory element 110) of the memory cell array MCA; and the data that is programmed to the magnetic memory element 110 can be read. In the nonvolatile memory device 620 thus configured, a trigger layer may be provided in the second ferromagnetic layer 20, and e.g. a single pulse current may be used as the programming current. Thus, a fast programming operation can be performed while suppressing the increase of the reversal current.

According to the embodiment, a memory device in which the reversal current in fast magnetization reversal is reduced.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the memory device such as the stacked body, the controller, the first ferromagnetic layer, the second ferromagnetic layer, the first portion, the second portion, the first nonmagnetic layer, the pulse current, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all memory devices practicable by an appropriate design modification by one skilled in the art based on the memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

What is claimed is:

1. A memory device comprising:
a stacked structure including
a first magnetic layer,
a second magnetic layer stacked with the first magnetic layer, the second magnetic layer including
a first portion, and
a second portion stacked with the first portion in a stacking direction of the first magnetic layer and the second magnetic layer, a magnetic resonance frequency of the first portion being different from a magnetic resonance frequency of the second portion, and
a first nonmagnetic layer provided between the first magnetic layer and the second magnetic layer; and
a controller electrically connected to the stacked structure, the controller causing
a pulse current having a magnitude of a first value to flow in the stacked structure in a first period,
no current to flow in the stacked structure in a second period before the first period, and
no current to flow in the stacked structure in a third period after the first period, wherein
a length of the first period being not less than 0.9 times and not more than 1.1 times the absolute value of an odd number times of the reciprocal of a magnetic resonance frequency of the second magnetic layer.

2. The device according to claim 1, wherein
the magnetic resonance frequency of the first portion is a first magnetic resonance frequency, and
the magnetic resonance frequency of the second portion is a second magnetic resonance frequency lower than the first magnetic resonance frequency.

3. The device according to claim 2, wherein at least one selected from a group consisting of the first portion and the second portion includes a Heusler alloy including at least one selected from a group consisting of Co, Mn, Fe, Ni, Cu, Rh, Ru, and Pd.

4. The device according to claim 2, wherein at least one selected from a group consisting of the first portion and the second portion includes at least one selected from a group consisting of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

5. The device according to claim 2, wherein at least one selected from a group consisting of the first portion and the second portion includes at least one selected from a group consisting of $Co_2HfSn$, $Co_2ZrSn$, $Co_2HfAl$, $Co_2ZrAl$, $CO_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

6. The device according to claim 2, wherein
the first portion includes at least one selected from a group consisting of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$, and
the second portion includes at least one selected from a group consisting of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$ $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

7. The device according to claim 2, wherein
the first magnetic resonance frequency is 20 GHz or more, and
the second magnetic resonance frequency is less than 20 GHz.

8. The device according to claim 1, wherein
a perpendicular magnetization component parallel to the stacking direction of a magnetization of the first magnetic layer is larger than an in-plane magnetization component perpendicular to the stacking direction of the magnetization of the first magnetic layer,
the perpendicular magnetization component of a magnetization of the first portion is larger than the in-plane magnetization component of the magnetization of the first portion, and
the perpendicular magnetization component of a magnetization of the second portion is larger than the in-plane magnetization component of the magnetization of the second portion.

9. The device according to claim 1, wherein
a plurality of the second magnetic layers and a plurality of the first nonmagnetic layers are provided,
the plurality of second magnetic layers is arranged in an in-plane direction perpendicular to the stacking direction, and
the plurality of first nonmagnetic layers is disposed respectively between the first magnetic layer and each of the plurality of second magnetic layers.

10. The device according to claim 1, wherein
a plurality of the second magnetic layers is provided,
the plurality of second magnetic layers is arranged in an in-plane direction perpendicular to the stacking direction, and
the first nonmagnetic layer is disposed between the first magnetic layer and the plurality of second magnetic layers.

11. The device according to claim 1, further comprising:
a first interconnect electrically connected to the first magnetic layer; and
a second interconnect electrically connected to the second magnetic layer,
the controller being connected to the stacked structure via the first interconnect and the second interconnect.

12. The device according to claim 11, further comprising a selection transistor provided between the first magnetic layer and the first interconnect and/or between the second magnetic layer and the second interconnect.

13. The device according to claim 1, wherein a length of the second magnetic layer in a direction perpendicular to the stacking direction is 35 nanometers or less.

14. The device according to claim 1, further comprising a magnetic shield opposing at least a portion of a side surface of the stacked structure extending in the stacking direction.

15. The device according to claim 1, wherein a length of the stacked structure in a direction perpendicular to the stacking direction decreases in a direction from the first magnetic layer toward the second magnetic layer.

16. The device according to claim 1, wherein pulse width of the pulse current is 2 nanoseconds or less.

17. A memory device comprising:
a stacked structure including
a first magnetic layer,
a second magnetic layer stacked with the first magnetic layer, the second magnetic layer including
a first portion, and
a second portion stacked with the first portion in a stacking direction of the first magnetic layer and the second magnetic layer, a magnetic resonance frequency of the first portion being a first magnetic resonance frequency, a magnetic resonance frequency of the second portion being a second magnetic resonance frequency lower than the first magnetic resonance frequency, and
a first nonmagnetic layer provided between the first magnetic layer and the second magnetic layer; and
a controller electrically connected to the stacked structure and causing a pulse current having a magnitude of a first value to flow in the stacked structure in a first period, wherein
a length of the first period being not less than 0.9 times and not more than 1.1 times the absolute value of an odd number times of the reciprocal of a magnetic resonance frequency of the second magnetic layer, and the magnetic resonance frequency of the second magnetic layer is between the first magnetic resonance frequency and the second magnetic resonance frequency.

18. A memory device comprising:
a stacked structure including
a first magnetic layer,
a second magnetic layer stacked with the first magnetic layer, the second magnetic layer including
a first portion, and
a second portion stacked with the first portion in a stacking direction of the first magnetic layer and the second magnetic layer, a magnetic resonance frequency of the first portion being different from a magnetic resonance frequency of the second portion, and
a first nonmagnetic layer provided between the first magnetic layer and the second magnetic layer; and
a controller electrically connected to the stacked structure and causing a pulse current having a magnitude of a first value to flow in the stacked structure in a first period, wherein
a length of the first period being not less than 0.9 times and not more than 1.1 times the absolute value of an odd number times of the reciprocal of a magnetic resonance frequency of the second magnetic layer, and
rise time of the pulse current being less than 300 picoseconds.

* * * * *